(12) United States Patent
Nakata et al.

(10) Patent No.: US 12,648,240 B2
(45) Date of Patent: Jun. 2, 2026

(54) IMAGING ELEMENT AND ELECTRONIC DEVICE

(71) Applicant: Sony Semiconductor Solutions Corporation, Kanagawa (JP)

(72) Inventors: Masashi Nakata, Kanagawa (JP); Hirotaka Shinozaki, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 434 days.

(21) Appl. No.: 18/246,111

(22) PCT Filed: Oct. 4, 2021

(86) PCT No.: PCT/JP2021/036646
§ 371 (c)(1),
(2) Date: Mar. 21, 2023

(87) PCT Pub. No.: WO2022/085406
PCT Pub. Date: Apr. 28, 2022

(65) Prior Publication Data
US 2023/0369358 A1 Nov. 16, 2023

Related U.S. Application Data

(60) Provisional application No. 63/093,447, filed on Oct. 19, 2020.

(51) Int. Cl.
*H10F 39/00* (2025.01)
*H10F 39/18* (2025.01)
(52) U.S. Cl.
CPC ......... *H10F 39/803* (2025.01); *H10F 39/182* (2025.01); *H10F 39/184* (2025.01); *H10F 39/8053* (2025.01); *H10F 39/811* (2025.01)

(58) Field of Classification Search
CPC .... H10F 39/803; H10F 39/182; H10F 39/184; H10F 39/8053; H10F 39/811;
(Continued)

(56) References Cited

U.S. PATENT DOCUMENTS

| | | | | |
|---|---|---|---|---|
| 2019/0293848 A1* | 9/2019 | Morimitsu | ............ | H10F 39/805 |
| 2020/0021782 A1* | 1/2020 | Sugizaki | ............... | H10F 39/182 |
| 2020/0120315 A1* | 4/2020 | Ho | ........................ | H10F 39/806 |

FOREIGN PATENT DOCUMENTS

| | | |
|---|---|---|
| EP | 2738810 A1 | 6/2014 |
| EP | 3934236 A1 | 1/2022 |

(Continued)

OTHER PUBLICATIONS

International Search Report (PCT/ISA/210) and Written Opinion (PCT/ISA/220, PCT/ISA/237), International Application No. PCT/JP2021/036646, dated Nov. 22, 2021.

*Primary Examiner* — Lex H Malsawma
*Assistant Examiner* — Ethan Edward Cutler
(74) *Attorney, Agent, or Firm* — Michael Best & Friedrich LLP

(57) ABSTRACT

According to the present disclosure, there is provided an imaging element configured as a semiconductor chip, the imaging element including: an acquisition unit that acquires information regarding an optical member, the optical member being provided outside the semiconductor chip; a pixel unit including N (N is an integer) types of pixels having different spectral characteristics with respect to a wavelength of input light input via the optical member; a conversion unit that converts an output signal of the pixel unit into a digital output signal; a processing unit that performs conversion processing into N+1 or more processed signals having different spectral characteristics on the basis of an output signal output from the conversion unit by using the (Continued)

information; and an output unit that outputs a signal based on the processed signal to an outside of the semiconductor chip.

26 Claims, 23 Drawing Sheets

(58) Field of Classification Search
CPC ..... G01J 3/2823; G02B 5/201; G02B 27/017; G02B 2027/0178; H04N 25/131; H04N 25/135; H04N 25/136; H04N 23/12; H04N 23/54; H04N 25/58; H04N 25/77
See application file for complete search history.

(56) References Cited

FOREIGN PATENT DOCUMENTS

| | | | |
|---|---|---|---|
| JP | 2007300253 | A | 11/2007 |
| JP | 2008136251 | A | 6/2008 |
| JP | 2010212979 | A | 9/2010 |
| JP | 2013030626 | A | 2/2013 |
| JP | 2013045917 | A | 3/2013 |
| JP | 2018098341 | A | 6/2018 |
| JP | 2018098641 | A | 6/2018 |
| JP | 2020052378 | A | 4/2020 |
| KR | 20110074488 | A | 6/2011 |
| KR | 20140053948 | A | 5/2014 |
| KR | 20150135208 | A | 12/2015 |
| WO | 2010047256 | A1 | 4/2010 |
| WO | 2017141544 | A1 | 8/2017 |
| WO | WO-2019151029 | A1 | 8/2019 |
| WO | 2020031655 | | 2/2020 |
| WO | WO-2020202904 | A1 | 10/2020 |

* cited by examiner

*FIG. 1*

| G | B | Y | C |
|---|---|---|---|
| R | IR | M | W |
| Y | C | G | B |
| M | W | R | IR |

Figure 6C:
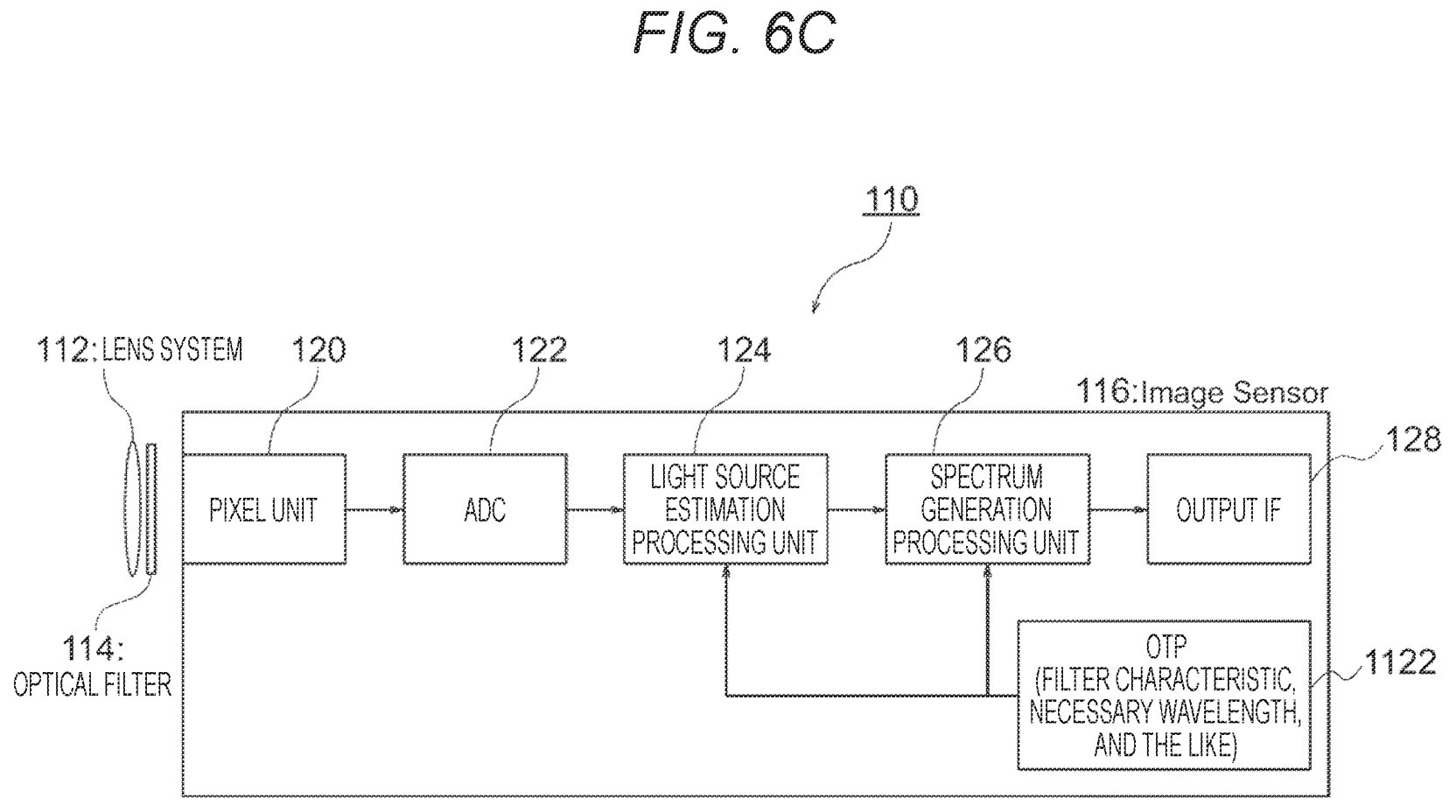

112: LENS SYSTEM

114: OPTICAL FILTER

116: Image Sensor

120 PIXEL UNIT

122 ADC

124 LIGHT SOURCE ESTIMATION PROCESSING UNIT

126 SPECTRUM GENERATION PROCESSING UNIT

128 OUTPUT IF

1122 OTP (FILTER CHARACTERISTIC, NECESSARY WAVELENGTH, AND THE LIKE)

Figure 8B:
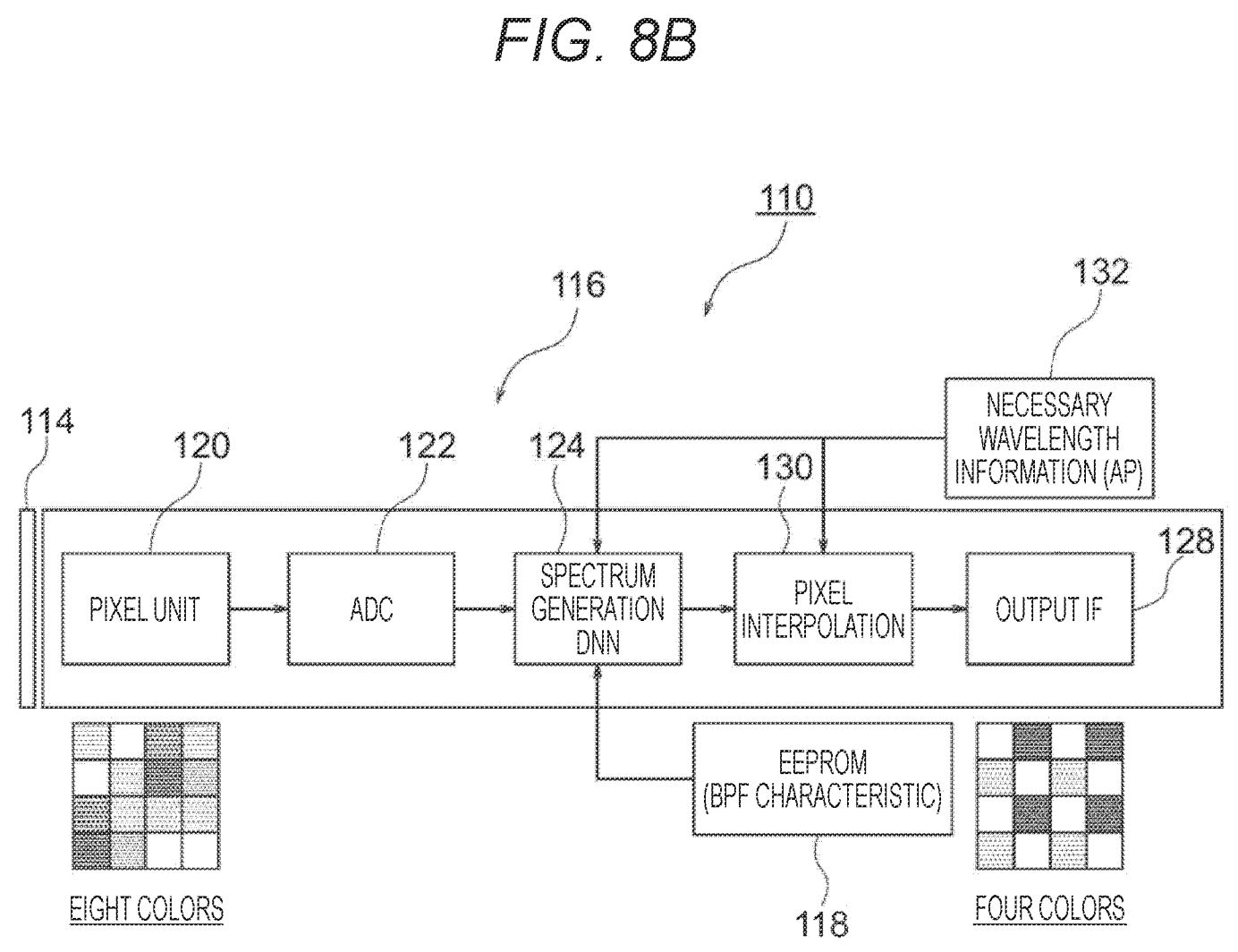

132
NECESSARY
WAVELENGTH
INFORMATION (AP)

128

114

120
PIXEL UNIT

122
ADC

124
SPECTRUM
GENERATION
DNN

130
PIXEL
INTERPOLATION

OUTPUT IF

118
EEPROM
(BPF CHARACTERISTIC)

FOUR COLORS

EIGHT COLORS

FIG. 9

COMPLEMENTARY COLOR & RGB - IR

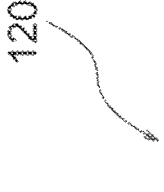
*FIG. 11*
COMPLEMENTARY COLOR + RGB

COMPLEMENTARY COLOR & G + RGB

*FIG. 13*
COMPLEMENTARY COLOR + RGBW
120b
| | | | |
|---|---|---|---|
| W | R | W | R |
| B | G | B | G |
| W | R | W | R |
| B | G | B | G |
| | | | |
|---|---|---|---|
| Y | Y | Y | M |
| C | Y | C | Y |
| Y | M | Y | M |
| C | Y | C | Y |
120a

120

| G | Y | B | C |
|---|---|---|---|
| G | Y | B | C |
| Y | G | C | B |
| Y | G | C | B |
| R | M | G | Y |
| R | M | G | Y |
| M | R | Y | G |
| M | R | Y | G |

DURING HDR OR
ULTRA-HIGH SENSITIVITY Mode

Figure 17:
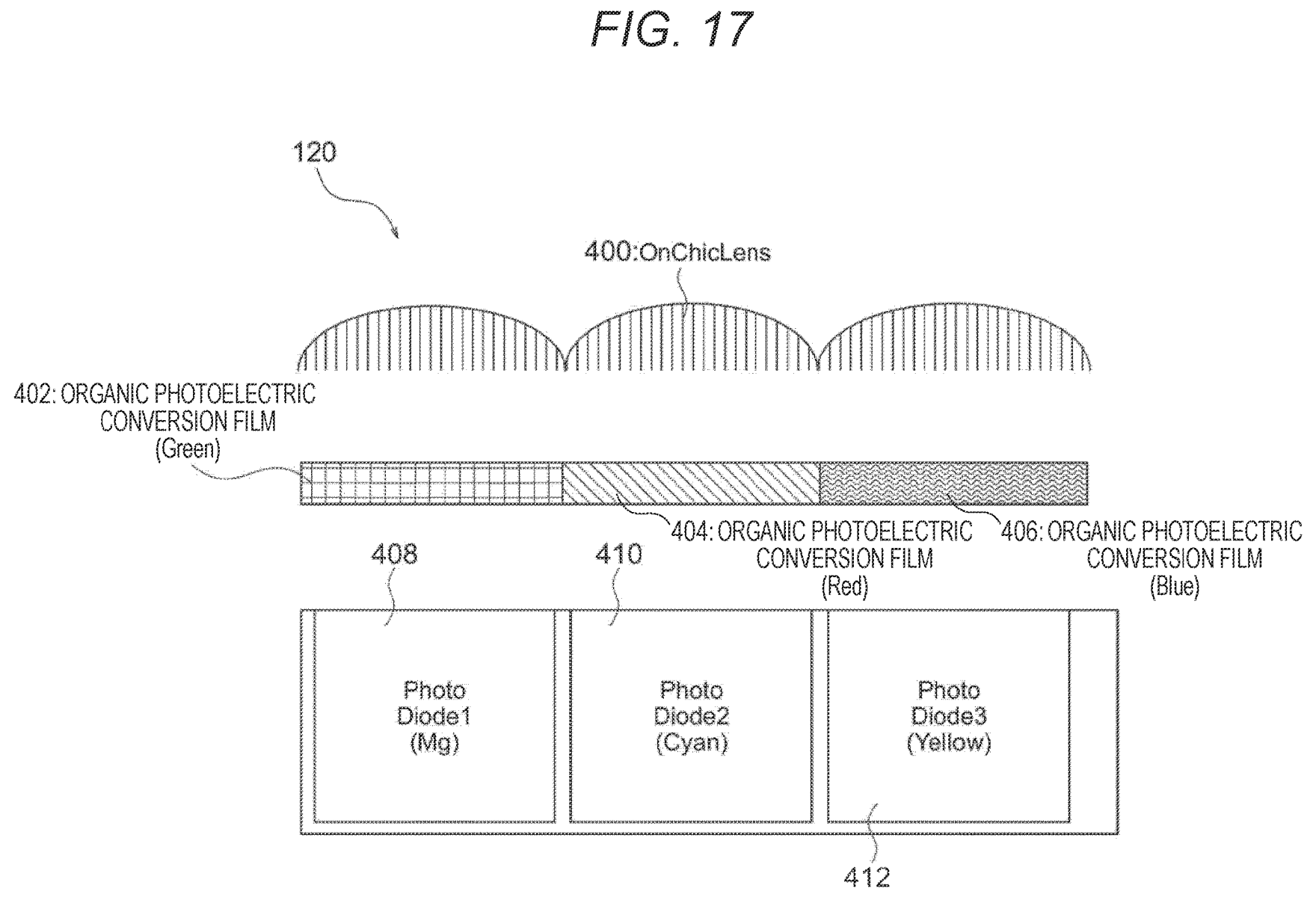

400:OnChicLens

402: ORGANIC PHOTOELECTRIC
CONVERSION FILM
(Green)

404: ORGANIC PHOTOELECTRIC
CONVERSION FILM
(Red)

406: ORGANIC PHOTOELECTRIC
CONVERSION FILM
(Blue)

408

410

412

Photo
Diode1
(Mg)

Photo
Diode2
(Cyan)

Photo
Diode3
(Yellow)

Figure 18:
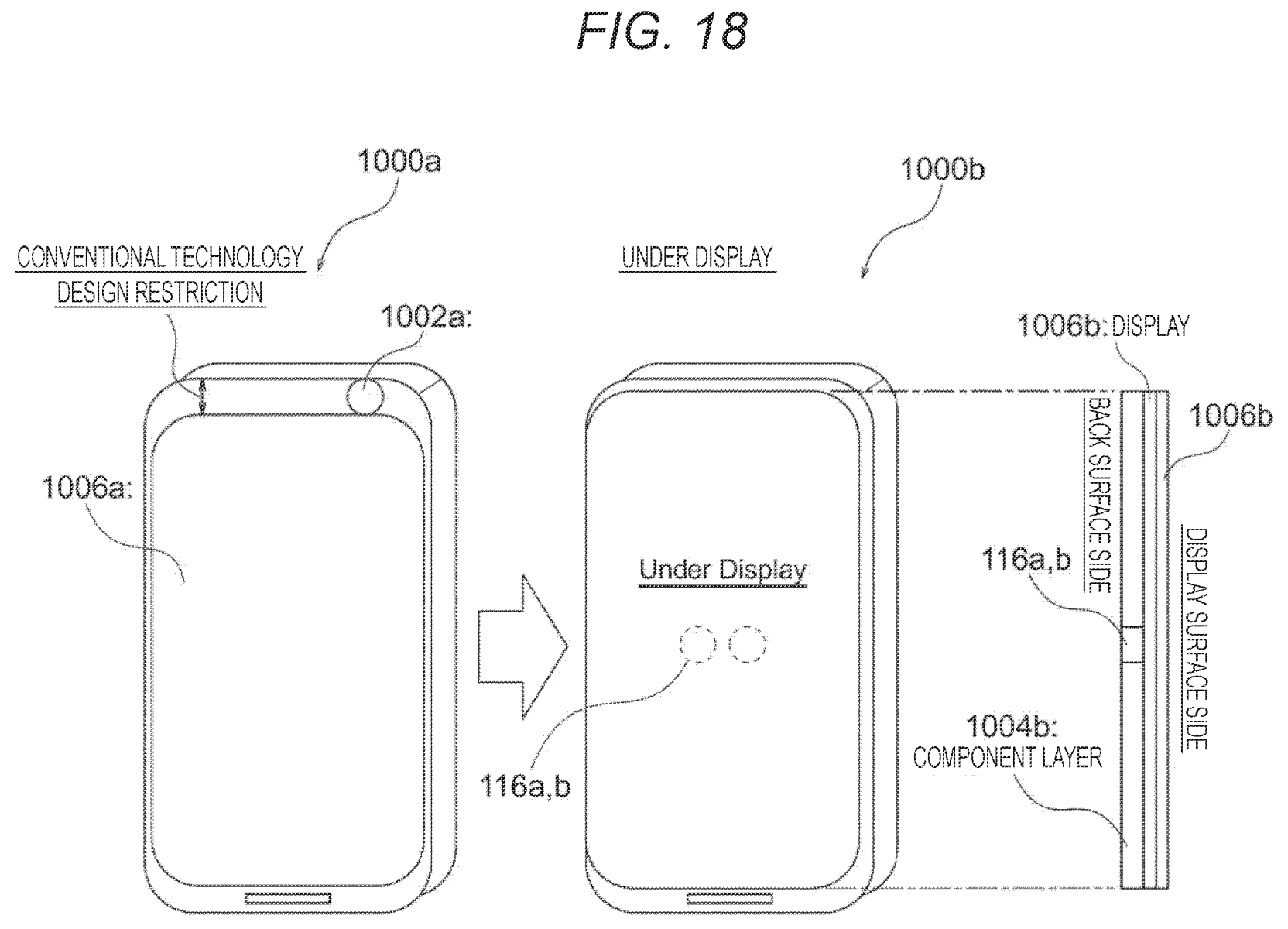

UNDER DISPLAY

1006b

1006b: DISPLAY

DISPLAY SURFACE SIDE

BACK SURFACE SIDE 116a,b

1004b:
COMPONENT LAYER

Under Display 116a,b

1000a

CONVENTIONAL TECHNOLOGY
DESIGN RESTRICTION

1002a:

1006a:

IMAGING ELEMENT AND ELECTRONIC DEVICE

TECHNICAL FIELD

Embodiments of the present invention relate to an imaging element and an electronic device.

BACKGROUND ART

A multispectral (multi spectrum or multispectral) image is an image in which electromagnetic waves of a plurality of wavelength bands are recorded. The multispectral image has, as an image signal, information of electromagnetic waves in a wavelength band of invisible light such as ultraviolet rays, infrared rays, and external infrared rays in addition to information of electromagnetic waves in a wavelength band of visible light. Thus, the multispectral image is used for visualizing an object that cannot be identified by eyes or used for object identification or state determination.

That is, unlike a general imaging element for image capturing, it is necessary to have more spectral characteristics than red/green/blue (which may be hereinafter described as R, G, and B), cyan, magenta, and yellow (which may be hereinafter described as C, M, and Y) of primary colors. Thus, an imaging element for multispectral images generally has five or more wavelength characteristics although depending on the application.

CITATION LIST

Patent Document

Patent Document 1: Japanese Patent Application Laid-Open No. 2008-136251
Patent Document 2: Japanese Patent Application Laid-Open No. 2013-45917

SUMMARY OF THE INVENTION

Problems to be Solved by the Invention

On the other hand, in order to have fine spectral characteristics (for example, see FIG. 20), it is necessary to provide such a number of filters. For this reason, when mounting in the imaging element is assumed, the number of pixels in one wavelength band with respect to the total number of pixels decreases, and there is a possibility that the resolution for one wavelength band decreases.

In addition, when a signal corresponding to each wavelength band is output from the imaging element and then is converted into a different spectrum using calculation, the processing time increases due to an increase in the amount of calculation or the like. Thus, in software processing in an electronic device such as a smartphone, real-time processing may be hindered. In particular, it is necessary to redundantly output the image signal with respect to the finally generated image signal, and the data amount also increases.

Furthermore, a pixel array of an imaging element for multispectral images (the imaging element may be referred to as an image sensor) is different from a pixel array (for example, Bayer) in 2×2 units of a normal imaging element for camera imaging. For example, the pixel array of the imaging element for multispectral images produces a pixel output of 2×4 units or 3×3 units or more. Thus, in an application processor or the like at a subsequent stage that processes an image signal output from the imaging element for multispectral images, it is necessary to cope with such an arrangement cycle.

Solutions to Problems

In order to solve the above problem, according to the present disclosure, there is provided an imaging element configured as a semiconductor chip, the imaging element including:

an acquisition unit that acquires information regarding an optical member, the optical member being provided outside the semiconductor chip;

a pixel unit including N (N is an integer) types of pixels having different spectral characteristics with respect to a wavelength of input light input via the optical member;

a conversion unit that converts an output signal of the pixel unit into a digital output signal;

a processing unit that performs conversion processing into N+1 or more processed signals having different spectral characteristics on the basis of an output signal output from the conversion unit by using the information; and an output unit that outputs a signal based on the processed signal to an outside of the semiconductor chip.

The pixel unit may include a plurality of photoelectric conversion elements that converts the input light into the output signal via N types of filters.

The N may be 5 or more.

The imaging element may be configured in one semiconductor chip portion or in a plurality of adjacent semiconductor chip portions.

The information may relate to an optical characteristic of the optical member between the imaging element and the subject, and relate to at least one of transmittance, reflectance, refractive index, emission wavelength, or wavelength dependency.

The optical member may be at least one of a color filter, a plasmon, or an organic photoelectric conversion film.

The N types of filters may include four or more types of filters among filters that transmit any of red color light, green color light, blue color light, cyan color light, magenta color light, and yellow color light.

The acquisition unit may be a memory (EEPROM) capable of storing the information from outside the semiconductor chip, and the information from outside the semiconductor chip stored in the memory may be supplied to the processing unit.

The optical member may be a band pass filter.

The band pass filter may transmit light in a predetermined visible light region and light in a predetermined infrared (IR) region.

The processing unit may be capable of performing processing using a parameter related to an image-capturing environment, and the acquisition unit may be capable of acquiring the parameter including at least information regarding a light source estimation result.

The processed signal output by the processing unit may be image data according to predetermined array information, and the acquisition unit may be capable of acquiring at least one of information regarding the N+1 or more spectral characteristics or information regarding the array information.

Each of the processed signals may have a peak of photosensitivity in each of the N+1 or more wavelength bands in input light in a predetermined wavelength range, and the processing unit may be capable of changing a range of at least one of the N+1 or more wavelength bands by parameter setting from outside the semiconductor chip.

The processed signal output by the processing unit may be image data according to predetermined array information, and the processing unit may be capable of changing a pixel array of the image data by parameter setting from outside the semiconductor chip.

The optical member may be at least a display panel for display, and the processing unit may generate the processed signal by using at least information regarding an optical characteristic of the display panel.

The processing unit may generate the processed signal also on the basis of output signals generated by different imaging elements.

The pixel unit may include one of an organic photoelectric conversion film and a divided photodiode divided in a cross-sectional direction.

In the processing unit, a combination in the processed signal generated in a first frame may be different from a combination in the processed signal generated in a second frame generated next to the first frame.

The processing unit may generate M (M is an integer and M<N+1) processed signals in the N+1 of the processed signals as the first frame, and generate remaining processed signals in the N+1 of the processed signals as the second frame.

In the pixel unit, the pixel unit may be subjected to different exposure control between frames or between pixels.

The pixel unit may include at least one of a white pixel or a gray pixel having sensitivity in a wide wavelength band overlapping with a wavelength band having sensitivity of another pixel with respect to input light in the predetermined wavelength range.

In spectral characteristics of the N types of filters, there may be an overlap at one or more positions of a wavelength band to be transmitted.

The spectral characteristic may indicate a variation in magnitude of a processed signal with respect to input light in a predetermined wavelength range, and in a case where the optical member is a band pass filter, the processing unit may perform processing of further narrowing a half value width of a variation value of a processed signal with respect to a wavelength in input light in at least any one of the N+1 or more processed signals.

In the processing unit, the processing unit may include at least one processed signal having a common spectral characteristic in the processed signal in the first frame and the processed signal in the second frame, respectively.

The processing unit may be capable of performing dynamic correction of a subject by using a processed signal having the common spectral characteristic.

In order to solve the problems described above, according to the present disclosure, an electronic device including the imaging element may be provided.

BRIEF DESCRIPTION OF DRAWINGS

FIG. 1 is a diagram illustrating an example of a basic unit of a pixel unit according to the present embodiment.

FIG. 6B is a diagram illustrating another configuration example of the imaging module according to the present embodiment.

FIG. 6C is a diagram illustrating still another configuration example of the imaging module according to the present embodiment.

FIG. 8A is a diagram illustrating a configuration example of the imaging module according to a third embodiment.

FIG. 8B is a diagram illustrating a configuration example of the imaging module without a lens.

FIG. 9 is a diagram illustrating a configuration example of the imaging module according to a fourth embodiment.

FIG. 11 is a diagram illustrating a pixel array example of basic units of the pixel units different from those in FIG. 10.

FIG. 13 is a diagram illustrating a pixel array example of basic units of the pixel units different from those in FIGS. 10 to 12.

FIG. 17 is a diagram illustrating a part of a cross-sectional view of the pixel unit according to a sixth embodiment.

FIG. 18 is a diagram illustrating an example in which the imaging modules are applied to a smartphone as an electronic device.

MODE FOR CARRYING OUT THE INVENTION

Figure 2:
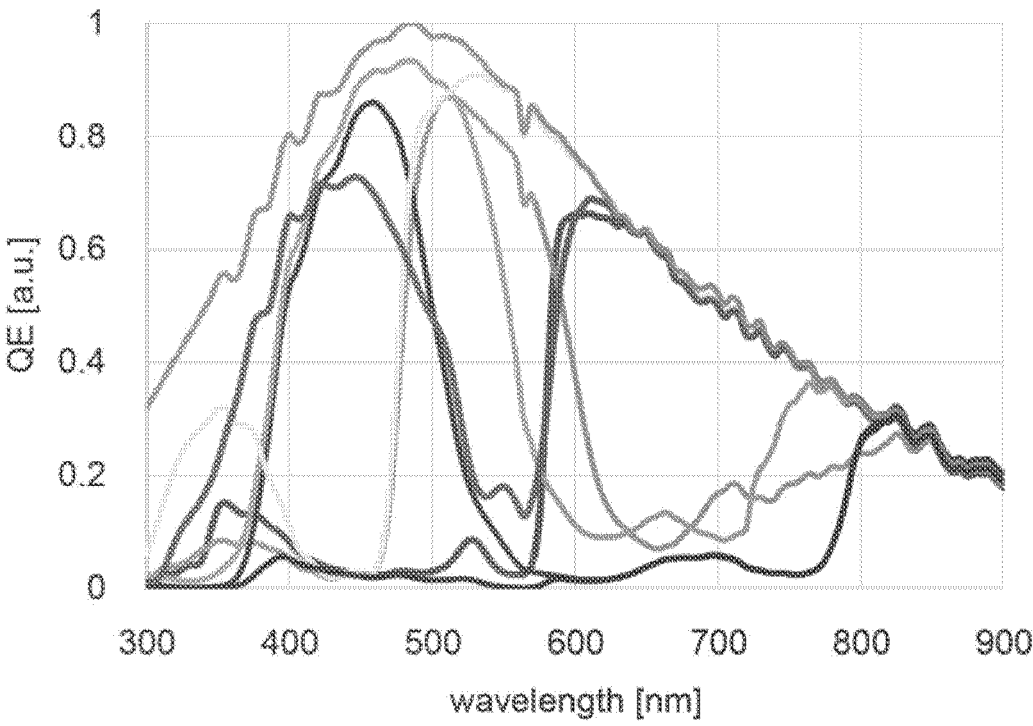
FIG. 2 is a diagram illustrating spectral characteristics of pixels.

Hereinafter, embodiments of the present invention will be described with reference to the drawings. Note that, in the drawings attached to the present specification, for convenience of illustration and ease of understanding, scales, vertical and horizontal dimensional ratios, and the like are appropriately changed and exaggerated from actual ones.

First Embodiment

Figure 1:
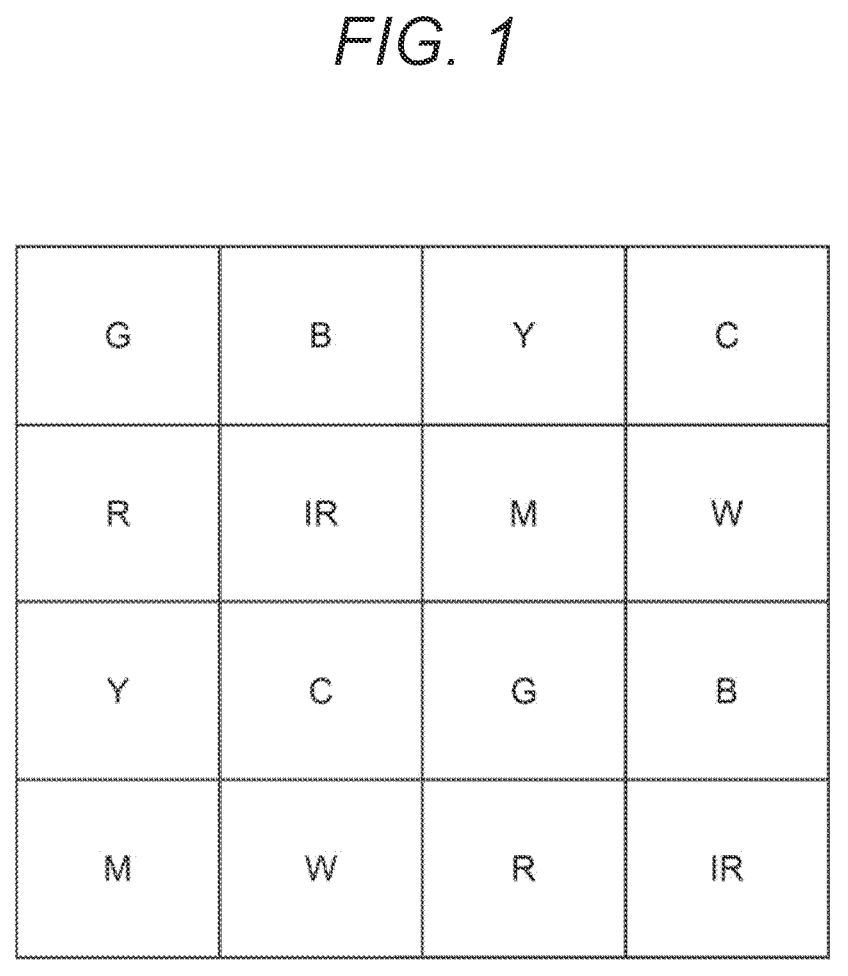

FIG. 1 is a diagram illustrating an example of a basic unit of a pixel unit 120 according to the present embodiment. In the present embodiment, when the light receiving surface is divided into rectangular pixel blocks including a plurality of pixels, the pixel blocks are referred to as basic units. FIG. 1 illustrates 4×4 pixels as a pixel group constituting a basic unit. In the pixel unit 120 according to the present embodiment, for example, such basic units are repeatedly arranged horizontally and vertically. Note that the pixel unit 120 according to the present embodiment may include such basic units on the order of millions.

The types of the pixels R, B, G, Y, C, IR, M, and W are classified according to sensitivity characteristics with respect to a light receiving wavelength. In each pixel, for example, on-chip color filters of red (R), blue (B), green (G), yellow (Y), cyan (C), infrared (IR), magenta (M), and white (W) are formed. That is, reference numerals of R, B, G, Y, C, IR, M, and W are assigned so that the type of each pixel corresponds to the color filter. The red (R), blue (B), green (G), yellow (Y), cyan (C), infrared (IR), magenta (M), and white (W) filters have characteristics of transmitting light in a red band, a blue band, a green band, a yellow band, a cyan band, an infrared band, a magenta band, and a white band, respectively.

As illustrated in FIG. 1, in the top row, pixels corresponding to green (G), blue (B), yellow (Y), and cyan (C) are arranged in this order from the left. In a further lower row, pixels corresponding to red (R), infrared (IR, which may be expressed as black), magenta (M), and white (W) are arranged in this order from the left. In a further lower row, pixels corresponding to yellow (Y), cyan (C), green (G), and blue (B) are arranged in this order from the left. In the bottom row, pixels corresponding to magenta (M), white (W), red (R), and infrared (IR) are arranged in this order from the left.

FIG. 2 is a diagram illustrating spectral characteristics of the pixels R, B, G, Y, C, IR, M, and W. The vertical axis represents a quantum effect (QE), and the horizontal axis represents a wavelength. The quantum effect QE is a value obtained by dividing light receiving sensitivity with respect to a wavelength of the pixel R, B, G, Y, C, IR, M, or W by the wavelength. FIG. 2 illustrates spectral curves of eight types of quantum effects QE corresponding to outputs of the pixels R, B, G, Y, C, IR, M, and W. As illustrated in FIG. 2, input light that is input to the pixels R, B, G, Y, C, IR, M, and W is measured (dispersed) for each wavelength, and the ratio of a signal value to the light is represented as a spectral characteristic (spectral distribution). Thus, spectral curves indicating the spectral characteristics of the pixels R, B, G, Y, C, IR, M, and W indicate information such as what wavelength range of color a pixel has and what shape a peak has. FIG. 2 illustrates eight types of spectral curves corresponding to the outputs of the pixels R, B, G, Y, C, IR, M, and W.

Each of the spectral curves of the pixels R, B, G, Y, C, IR, M, and W has a broad spectral width (half value width). In the present embodiment, the number of signal values for a predetermined wavelength range, for example, 300 to 900 nanometers is referred to as a spectral number. For example, in FIG. 2, since there are eight spectral curves, the number of spectral curves is eight. Furthermore, in the present embodiment, the signal value may be referred to as a pixel value. Information indicating colors such as R, B, G, Y, C, IR, M, and W is associated with the signal value. Alternatively, information indicating colors such as R, B, G, Y, C, IR, M, and W is associated with information of an array of image data constituted by signal values.

Figure 3A:
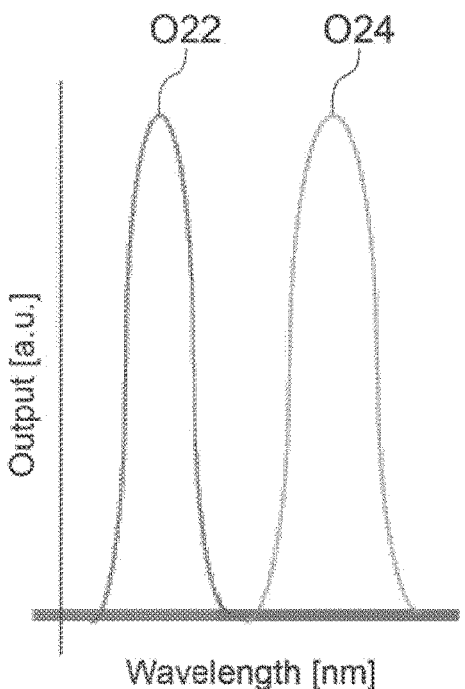
FIG. 3A is a diagram illustrating an example of output values for wavelengths of two pixels.
Figure 3B:
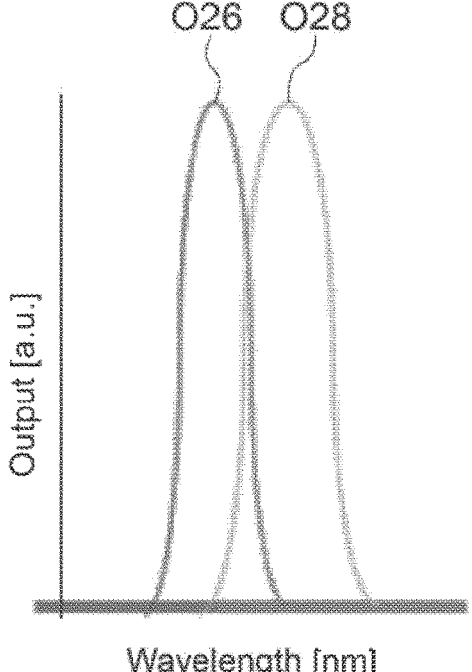
FIG. 3B is a diagram illustrating an example of output values for wavelengths of other two pixels.

FIG. 3A is a diagram illustrating an example of output values O22 and O24 for wavelengths of two pixels. The vertical axis represents an output value, and the horizontal axis represents a wavelength. In the example of FIG. 3A, there is no overlap between the output values O22 and O24 for the wavelengths of two pixels. On the other hand, FIG. 3B is a diagram illustrating an example of output values O26 and O28 for wavelengths of other two pixels. The vertical axis represents an output value, and the horizontal axis represents a wavelength. In the present embodiment, in a case where there is an overlap such as the output values O26 and O28, spectrum generation processing for reducing the overlap is performed.

For example, a combination of output signal values of the pixels R, B, G, Y, C, IR, M, and W is multiplied by a coefficient to generate a new output signal according to the spectral characteristic. More specifically, as illustrated in Expression (1), the signal value of the Y pixel is multiplied by a coefficient a, the signal value of the G pixel is multiplied by a coefficient −b, and the signal value of the B pixel is multiplied by a coefficient −c, and results are added. Thus, the output signal value α having a new spectral characteristic can be generated.

[Expression 1]

$$\alpha = aY - bG - cB \tag{1}$$

In this manner, for example, by calculating the color matrix of N rows and 8 columns with respect to the output signal values of the pixels R, B, G, Y, C, IR, M, and W, it is possible to obtain signal values having N new spectral characteristics. For example, the color matrix can be set in advance by an initial experiment at the time of manufacturing, calculation simulation, or the like.

Figure 4:
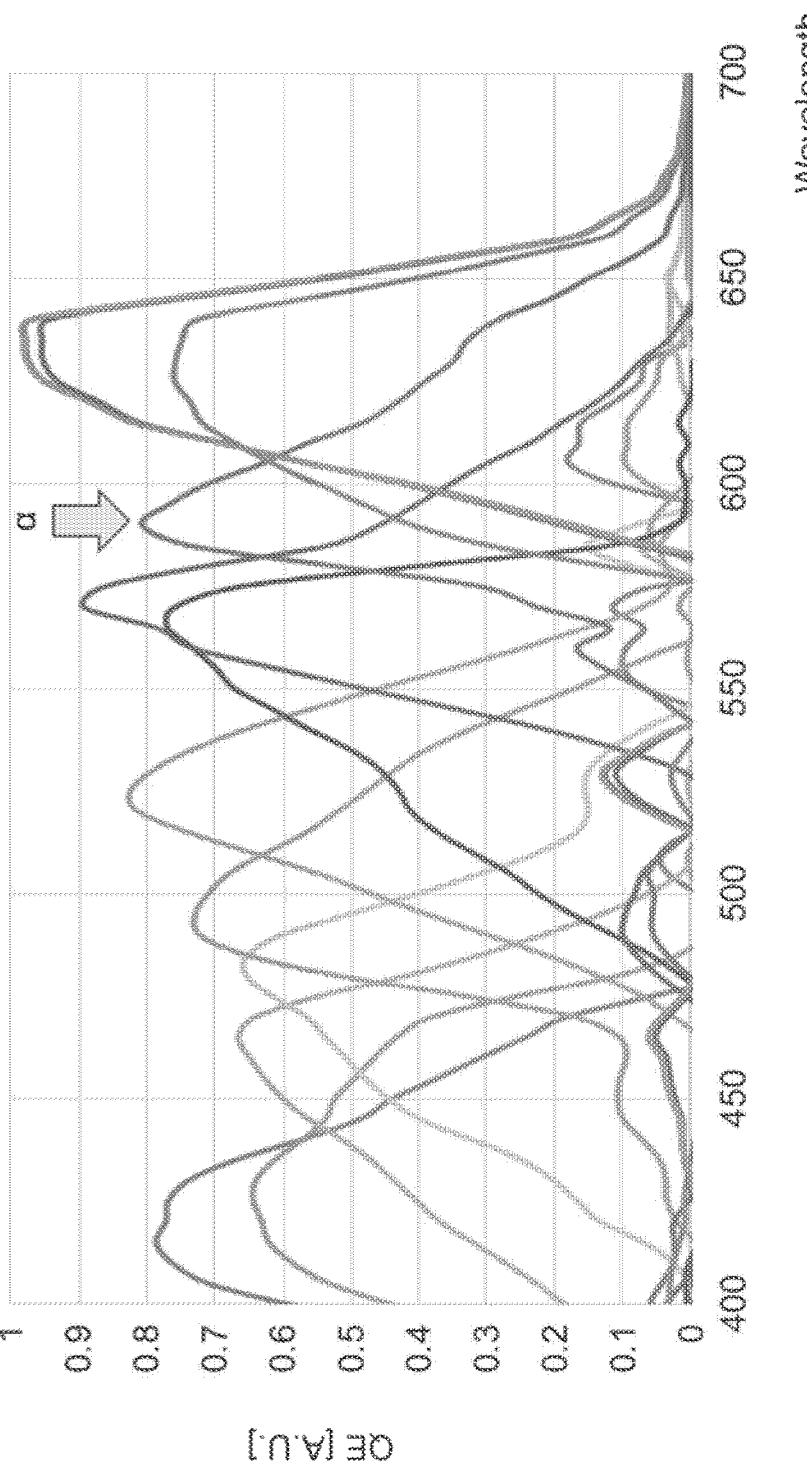
FIG. 4 is a diagram illustrating a processing example in which a color matrix operation of 12 rows and 8 columns is performed on an output signal value of a pixel.

FIG. 4 is a diagram illustrating an example of a processed signal obtained by performing a color matrix operation of 12 rows and 8 columns on the output signal values of the pixels R, B, G, Y, C, IR, M, and W illustrated in FIG. 2. α represents a peak position of the spectral characteristic illustrated in the Expression (1). That is, in the color matrix of 12 rows and 8 columns, the coefficients that are matrix parameters of the row corresponding to the output α is, for example, (0, −c, −b, a, 0, 0, 0, and 0). More specifically, assuming that the output values of the pixels R, B, G, Y, C, IR, M, and W are the signal value columns (R, B, G, Y, C, IR, M, and W), the row coefficient (0, −c, −b, a, 0, 0, 0, and 0)×the signal value column (R, B, G, Y, C, IR, M, and W) is expressed by Expression (1). Furthermore, in the present embodiment, for example, since the W pixel has a wider half value width in the quantum effect (QE), a wide spectral region can be covered. Thus, it is possible to obtain a processed signal having a new spectral characteristic covering a wide spectral region by calculation with the output signals of the other pixels R, B, G, Y, C, IR, and M. Note that this similarly same applies to gray in which transmittance of the W pixel is reduced, and a gray pixel may be used. As described above, the pixel according to the present embodiment includes at least one of a white pixel or a gray pixel having sensitivity in a predetermined wavelength range, for example, a wide wavelength band overlapping with a wavelength band having sensitivity of other pixels R, B, G, Y, C, IR, and M for input light of 300 to 1000 nanometers.

Furthermore, by performing calculation processing on the output signals of the pixels R, B, G, Y, C, IR, M, and W, the spectral characteristics of the imaging element can be changed according to the purpose. For example, in a color matrix of N rows and 8 columns, N can be greater than 8. As described above, in a case where the number of color filters is N, it is possible to generate an output having a spectral number of N+1 or more. In other words, the spectral characteristics (for example, see FIG. 20) can be made fine in a state where the number of color filters is suppressed. Thus, spectral characteristics can be made fine in a state in which a decrease in resolution is suppressed. Note that in the present embodiment, making the spectral characteristic finer means making the half value width of the spectral curve (see FIGS. 2 and 4) narrower than that before the processing and increasing the number of spectral curves.

Figure 5:
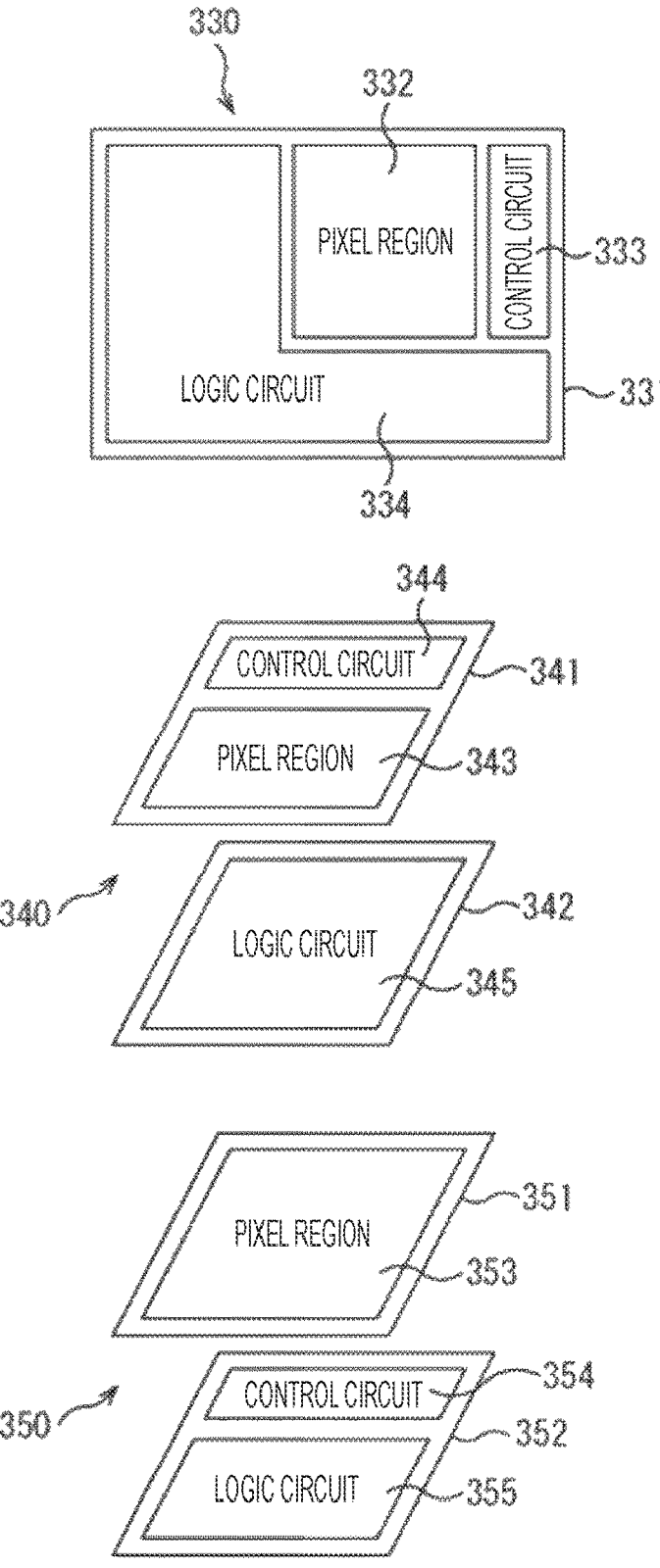
FIG. 5 is a diagram illustrating a configuration example of an imaging element according to the present embodiment.

Here, a basic schematic configuration of the imaging element according to the present embodiment will be described with reference to FIG. 5. FIG. 5 is a diagram illustrating a configuration example of the imaging element according to the present embodiment. As illustrated in FIG. 5, in the present embodiment, for example, a processing unit that performs signal processing as described above is configured in logic circuits 334, 345, and 355 in imaging elements (image sensors) 330, 340, and 350.

As a first example, the imaging element 330 illustrated in an upper part of FIG. 5 is configured by mounting a pixel region 332, a control circuit 333, and the logic circuit 334 including the above-described signal processing circuit in one semiconductor chip 331.

As a second example, the imaging element 340 illustrated in a middle part of FIG. 5 includes a first semiconductor chip portion 341 and a second semiconductor chip portion 342. A pixel region 343 and a control circuit 344 are mounted on the first semiconductor chip portion 341, and the logic circuit 345 including the above-described signal processing circuit is mounted on the second semiconductor chip portion 342. Then, the first semiconductor chip portion 341 and the second semiconductor chip portion 342 are electrically connected to each other, thereby forming the imaging element 340 as one semiconductor chip.

As a third example, the imaging element 350 illustrated in a lower part of FIG. 5 includes a first semiconductor chip portion 351 and a second semiconductor chip portion 352. The pixel region 353 is mounted on the first semiconductor chip portion 351, and the control circuit 354 and the logic circuit 355 including the signal processing circuit described above are mounted on the second semiconductor chip portion 352. Then, the first semiconductor chip portion 351 and the second semiconductor chip portion 352 are electrically connected to each other, thereby forming the imaging element 350 as one semiconductor chip.

Figure 6A:
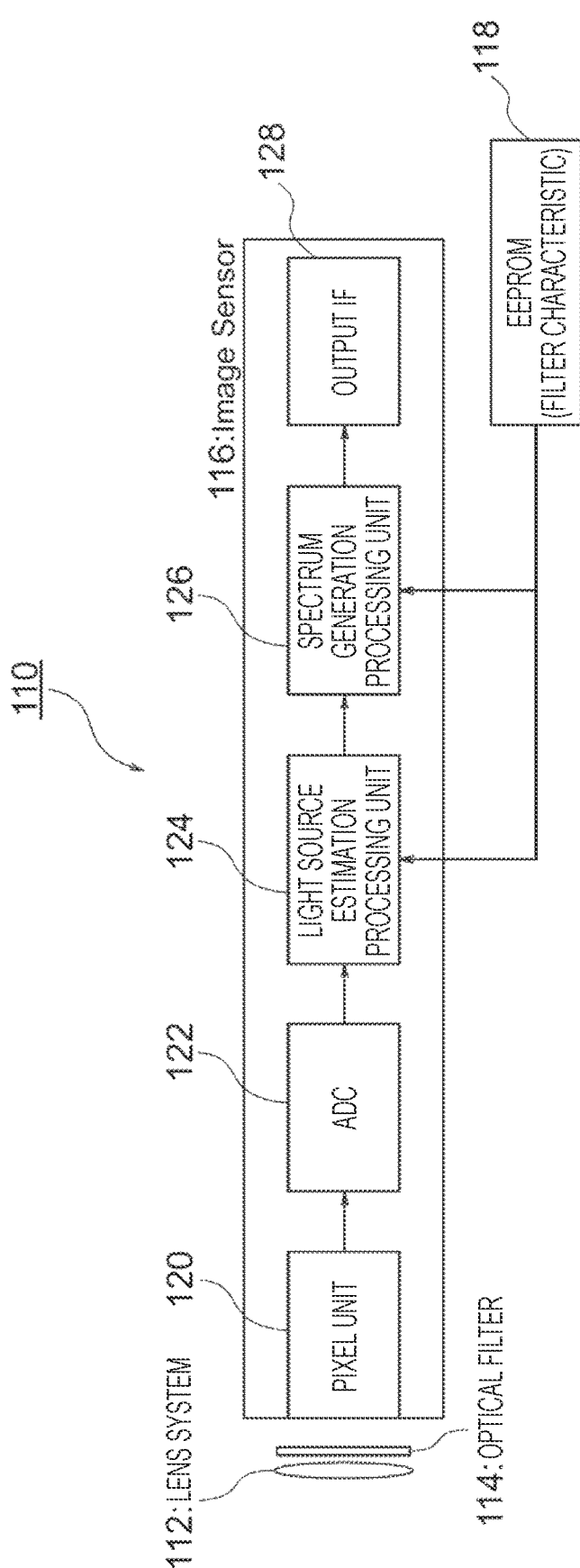
FIG. 6A is a diagram illustrating a configuration example of an imaging module according to the present embodiment.

FIG. 6A is a diagram illustrating a configuration example of an imaging module 110 according to the present embodiment. The imaging module 110 includes a lens system 112, an optical filter 114, an imaging element 116, and a storage unit (memory: EEPROM) 118.

The lens system 112 forms an image of light from a subject on the pixel unit 120 via the optical filter 114. The optical filter 114 is, for example, an infrared cut filter (IR-Cut Filter). Note that the optical filter 114 may not be provided. Furthermore, in general, the optical filter 114 is changed for the imaging element 116 according to the purpose of processing. For example, as described later, the optical filter 114 may use a band pass filter, plasmon, an organic photoelectric conversion film, or the like. That is, in the present embodiment, objects that affect the spectral shape (see FIG. 2) are collectively referred to as filters. As described above, since the lens system 112 and the optical filter 114 are attached after the imaging element 116 is manufactured, the signal processing unit of the imaging element 116 cannot recognize the characteristics of the lens system 112 and the filter including the optical filter 114 at the time of manufacture.

Furthermore, in the present embodiment, acquiring two-dimensional image data is generally referred to as image capturing. That is, imaging also includes outputting an output signal from the imaging element 11 as sensing data such as object identification and state recognition.

The imaging element 116 corresponds to, for example, the imaging elements (image sensors) 330, 340, and 350 illustrated in FIG. 5, and includes the pixel unit 120, an AD converter 122, a light source estimation unit 124, a spectrum generation processing unit 126, and an output interface 128. Note that the pixel unit 120 is configured in, for example, the pixel regions 332, 343, and 353 illustrated in FIG. 5. Furthermore, the AD converter 122, the light source estimation unit 124, and the spectrum generation processing unit 126 are configured in, for example, the logic circuits 334, 345, and 355 illustrated in FIG. 5. Note that the AD converter 122 according to the present embodiment corresponds to a conversion unit. Further, the light source estimation unit 124 and the spectrum generation processing unit 126 according to the present embodiment correspond to the processing unit. Furthermore, the output interface 128 according to the present embodiment corresponds to an output unit.

The pixel unit 120 includes, for example, the basic unit described in FIG. 1. Reflected light from a subject via the lens system 112 and the optical filter 114 is photoelectrically converted by each pixel of the pixel unit 120. That is, the pixel unit 120 here may be the pixel layout illustrated in FIG. 1, or may be another layout.

The AD converter 122 converts an output signal of each pixel of the pixel unit 120 into a digital signal value. Note that, in the present embodiment, data having a signal value and arrangement information of the signal value is referred to as image data or an image. That is, the AD converter 122 converts the output signal of each pixel of the pixel unit 120 into a digital signal value to generate a multispectral (multi spectrum or multispectral) image.

The light source estimation unit 124 performs light source estimation processing. The light source estimation unit 124 performs background detection on the multispectral image generated by the AD converter 122, for example, and sets a light source estimation region on the basis of a result of the background detection. Then, the light source estimation unit 124 performs estimation processing of the type of the light source when the multispectral image is captured on the basis of the light source estimation region.

The input light input to the imaging element 116 is indicated by, for example, subject reflectance×light source spectrum×lens transmittance×optical filter transmittance× spectral characteristics of pixels (see, for example, FIG. 2). Thus, in a case where a characteristic desired to be obtained in the multispectral image is subject reflectance, a light source spectrum, that is, a processing result of the light source estimation unit 124 is used to accurately recognize the subject reflectance. At this time, since the lens transmittance and the optical filter transmittance are unknown characteristics for the imaging element at the time of manufacturing, it is possible to further improve accuracy of the light source estimation processing by externally inputting filter characteristics including information such as the lens transmittance and the optical filter transmittance to the imaging element 116.

The spectrum generation processing unit 126 generates a processed signal corresponding to the spectrum, for example, by a color matrix operation including Expression (1). At this time, calculation processing is performed on the basis of the sensor spectrum. That is, in a case where the spectral characteristic changes in the lens system 112 and the optical filter 114, the spectral characteristic is calculated as the original spectrum. For example, the color matrix operation including Expression (1) is used as a base of the calculation processing, but in a case where the spectral characteristics change in the lens system 112 and the optical filter 114, the coefficients of the color matrix operation including Expression (1) are changed using the optical characteristics.

Note that the spectrum generation processing unit 126 according to the present embodiment generates a processed signal (which may be referred to as a pixel signal or a pixel value) corresponding to the spectrum by the color matrix operation including Expression (1), for example, but is not limited thereto. For example, the neural network (NN) may be caused to learn by learning data in which output signals of the pixels R, B, G, Y, C, IR, M, and W (see FIG. 2) are used as input signals and a processed signal corresponding to a target spectrum is used as a training signal. That is, the spectrum generation processing unit 126 may be configured using the learned neural network (NN). Also in this case, it is desirable to input the characteristics of the lens system 112 and the optical filter 114. In addition, the spectral characteristic itself may be input as the optical characteristic from the outside, or a parameter after some calculation is added may be input. For example, a matrix parameter used for a matrix operation such as a linear matrix or an inverse matrix operation may be input. Furthermore, the spectrum generation processing unit 126 also generates array information of a generated signal value on the basis of information supplied from the storage unit 118. As described above, the spectrum generation processing unit 126 converts the image data having N colors into image data having a color number of N+1 or more.

The processed signal having a predetermined spectral characteristic generated by the spectrum generation processing unit 126 is output via the output IF 128. Note that, as will be described later, the processed signal after processing of changing specifications of an output image such as pixel interpolation or pixel rearrangement is performed may be output via the output IF.

In conventional processing, processing of the spectrum generation processing unit 126 is executed by software processing or the like after output from the imaging element 116. Thus, in a case where processing is performed in a subsequent stage as in conventional processing, it is necessary to cause the imaging element 116 to output signals (image data) output from all the pixels. For example, in the above-described example, at least three output signals of the pixels Y, G, and B are necessary in order to obtain the spectrum $\alpha$. As described above, when the data size of the output signal increases, there is a harmful effect that the amount of data increases and affects the frame rate of the imaging element or power consumption increases. On the other hand, the spectrum generation processing unit 126 according to the present embodiment can perform calculation processing in the imaging element 116. Thus, the spectrum generation processing unit 126 according to the present embodiment can suppress an increase in the amount of data and suppress the influence of the frame rate of the imaging element 116 and the increase in power consumption.

Meanwhile, the processing of the spectrum generation processing unit 126 is implemented in the imaging element 116. If a calculation circuit such as the spectrum generation processing unit 126 is mounted in the imaging element 116, it is not possible to take into account many spectrum variation factors such as variations in the manufacturing process and characteristics of the optical filter 114 mounted in a subsequent process of the sensor manufacturing process. Thus, as illustrated in FIG. 6, the storage unit 118 enables information such as filter characteristics to be input from the outside of the imaging element 116. That is, the storage unit 118 supplies information including parameters needed by the light source estimation unit 124 and the spectrum generation processing unit 126. As described above, the parameter includes a matrix operation such as a linear matrix, a matrix parameter used for an inverse matrix operation, and the like. Note that a method of inputting information such as filter characteristics may be arbitrary, and the information may be directly input from the application processor via an arbitrary IF (I2C, I3C, SPI, MIPI, or the like).

Figure 6B:
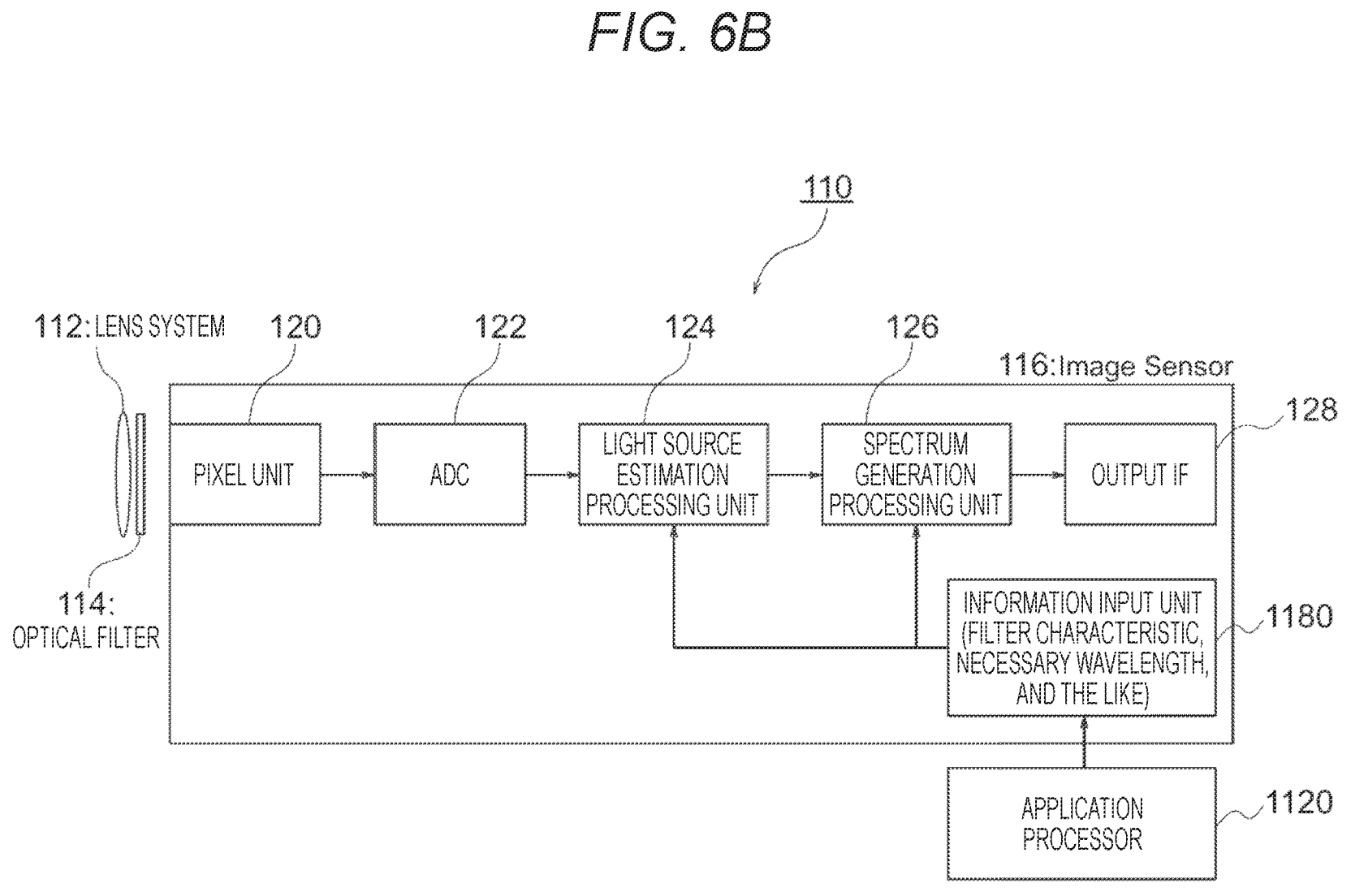

FIG. 6B is a diagram illustrating another configuration example of the imaging module 110 according to the present embodiment. The imaging module 110 includes the lens system 112, the optical filter 114, the imaging element 116, and an information input unit 1180. The information input unit 1180 stores, for example, adjustment values such as a filter characteristic and a necessary wavelength and optical characteristic information in association with parameters such as "1" and "2". Thus, for example, when parameters such as "1" and "2" are transmitted from the application processor 1120, adjustment values and optical characteristics associated with the parameters such as "1" and "2" are set in the light source estimation unit 124, the spectrum generation processing unit 126, and the like.

FIG. 6C is a diagram illustrating still another configuration example of the imaging module 110 according to the present embodiment. The imaging module 110 includes the lens system 112, the optical filter 114, the imaging element 116, and an internal storage unit (OTP) 1122. The internal storage unit 1122 has a configuration equivalent to that of the storage unit 118. That is, the internal storage unit 1122 supplies information including parameters needed by the light source estimation unit 124 and the spectrum generation processing unit 126. Note that the storage unit 118, the information input unit 1180, the internal storage unit 1122, and an arbitrary IF (I2C, I3C, SPI, MIPI, or the like) according to the present embodiment correspond to an acquisition unit.

As described above, according to the present embodiment, the spectrum generation processing unit 126 uses signal values of the pixels R, B, G, Y, C, IR, M, and W corresponding to the N color filters as input signals, and generates N+1 or more processed signals having predetermined spectral characteristics. Thus, it is possible to generate a signal value having a spectral number of N+1 or more. In addition, since the spectrum generation processing unit 126 is configured in the imaging element 116, it is possible to generate a signal value of N+1 or more having a predetermined spectral characteristic without outputting image data to the outside of the imaging element 116, and it is possible to suppress a load of data transfer. At this time, since information necessary for calculation processing such as filter characteristics can be input from the storage unit 118, an arbitrary IF (I2C, I3C, SPI, MIPI, or the like), and the like, it is possible to perform calculation processing of the light source estimation unit 124 and the spectrum generation processing unit 126 with higher accuracy even if the filter characteristics are changed or confirmed after the manufacturing of the imaging element 116.

Second Embodiment

The imaging module 110 according to the first embodiment uses an infrared cut filter (IR-Cut Filter) for the optical filter 114, but the imaging module 110 according to the first embodiment is different in that a band pass filter (BPF) is used for the optical filter 114. Hereinafter, differences from the imaging module 110 according to the first embodiment will be described.

Figure 7:
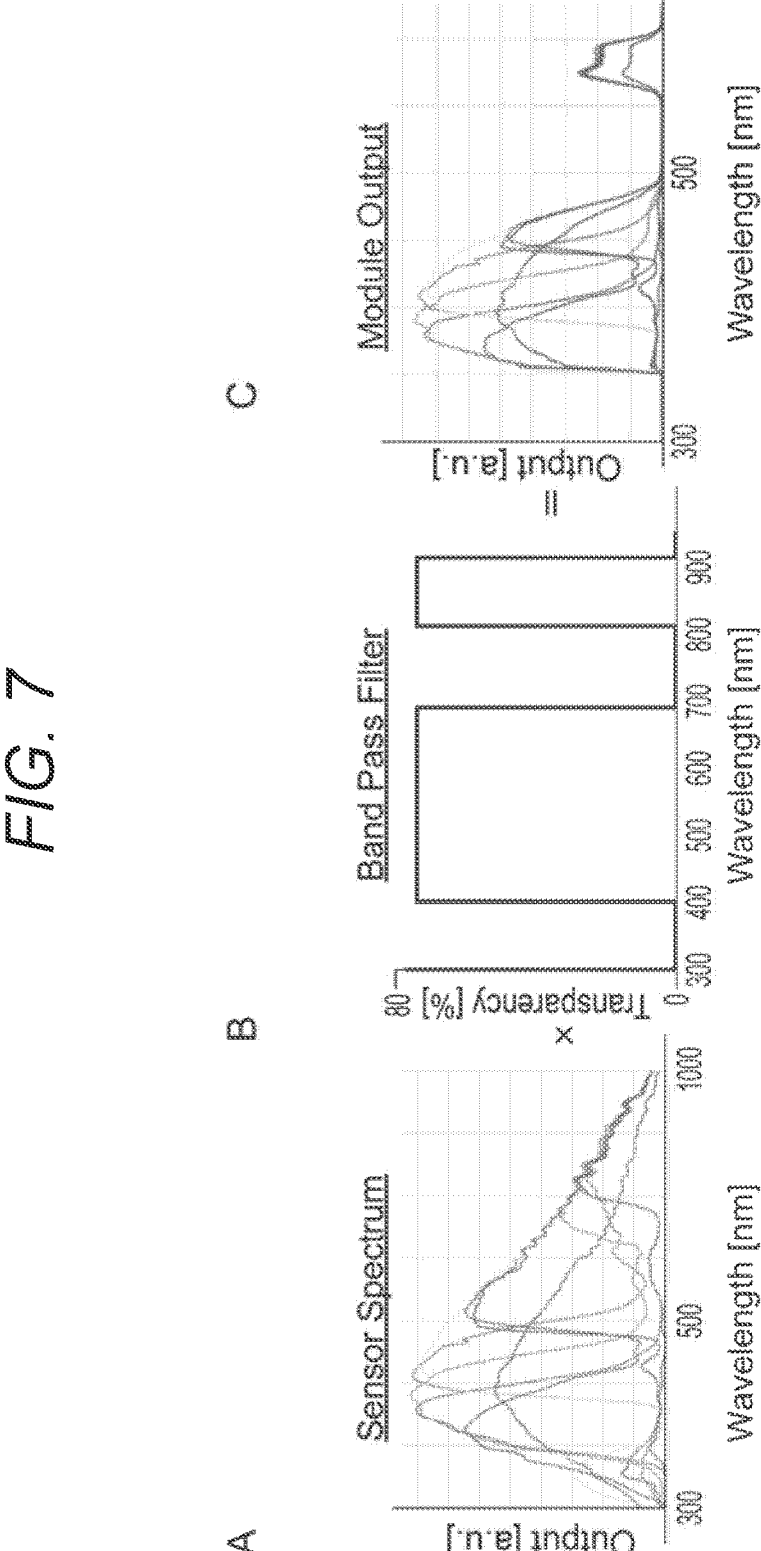
FIG. 7 is a diagram illustrating an output signal example of the imaging element in a case where a band pass filter is used.

FIG. 7 is a diagram illustrating an output signal example of the imaging element 116 in a case where a band pass filter is used. A left diagram A is an output example illustrating spectral characteristics of the pixel unit 120 in a case where the optical filter 114 is not provided. For example, a vertical axis represents a quantum effect as an output value (Outpou), and a horizontal axis represents a wavelength. A middle diagram B is a diagram illustrating a wavelength transmission characteristic of the band pass filter. The vertical axis represents transmittance (Transpareency), and the horizontal axis represents wavelength. A right diagram C is an output example illustrating spectral characteristics of the spectrum generation processing unit 126 in a case where the optical filter 114 is present.

As illustrated in the left diagram A, in a case where there is no band pass filter, for example, the spectral peak is reduced in the infrared (IR) region. Thus, even if the spectrum processing operation of the spectrum generation processing unit 126 is performed, it becomes difficult to generate a spectrum having a narrow half value width.

As illustrated in the middle diagram B, the band pass filter can narrow the transmitted light in the infrared (IR) region to, for example, only 800 to 900 nanometers. Similarly, the band pass filter can narrow the transmitted light in the visible light region to, for example, 400 to 700 nanometers. Thus, when the spectrum processing operation of the spectrum generation processing unit 126 is performed, a spectral curve with a narrow half value width can be obtained in the infrared (IR) region as illustrated in the right diagram C. Similarly, a spectral curve having a narrow half value width can be obtained in the visible light region.

In such a case, a signal including characteristic information of the band pass filter can be input from the storage unit 118 or an input system (see FIG. 6). In this case, other parameters calculated on the basis of the characteristics of the band pass filter may be used. Thus, for example, the coefficient that is a parameter of the linear matrix used in the calculation of the spectrum generation processing unit 126 can be changed to a coefficient more suitable for the characteristics of the band pass filter. That is, the parameter of the linear matrix corresponding to the band pass filter may be stored in advance in the storage unit 118 or may be input from the input system (see FIG. 6). Note that the band pass filter according to the present embodiment is arranged in the optical filter 114, but is not limited thereto. For example, a band pass filter may be configured in the imaging element 116.

As described above, according to the present embodiment, a band pass filter having a transmission characteristic in a specific wavelength region (400 to 700 nm or 800 to 900 nm) is used for the optical filter 114. Thus, the spectrum generation processing unit 126 can obtain a spectral curve with a narrow half value width in a wavelength region corresponding to a specific wavelength region (400 to 700 nm or 800 to 900 nm).

Third Embodiment

The imaging module 110 according to the first embodiment performs the spectrum processing of making the number of spectrums of each pixel of the unit part in the pixel unit 120 larger than the type N of the color filter arranged in the unit part, but the imaging module 110 according to the third embodiment is different in that it is also possible to perform the spectrum processing of making the number of spectrums of signal output of each pixel of the unit part in the pixel unit 120 smaller than the type N of the color filter arranged in the unit part. Hereinafter, differences from the imaging module 110 according to the first embodiment will be described.

Figure 8A:
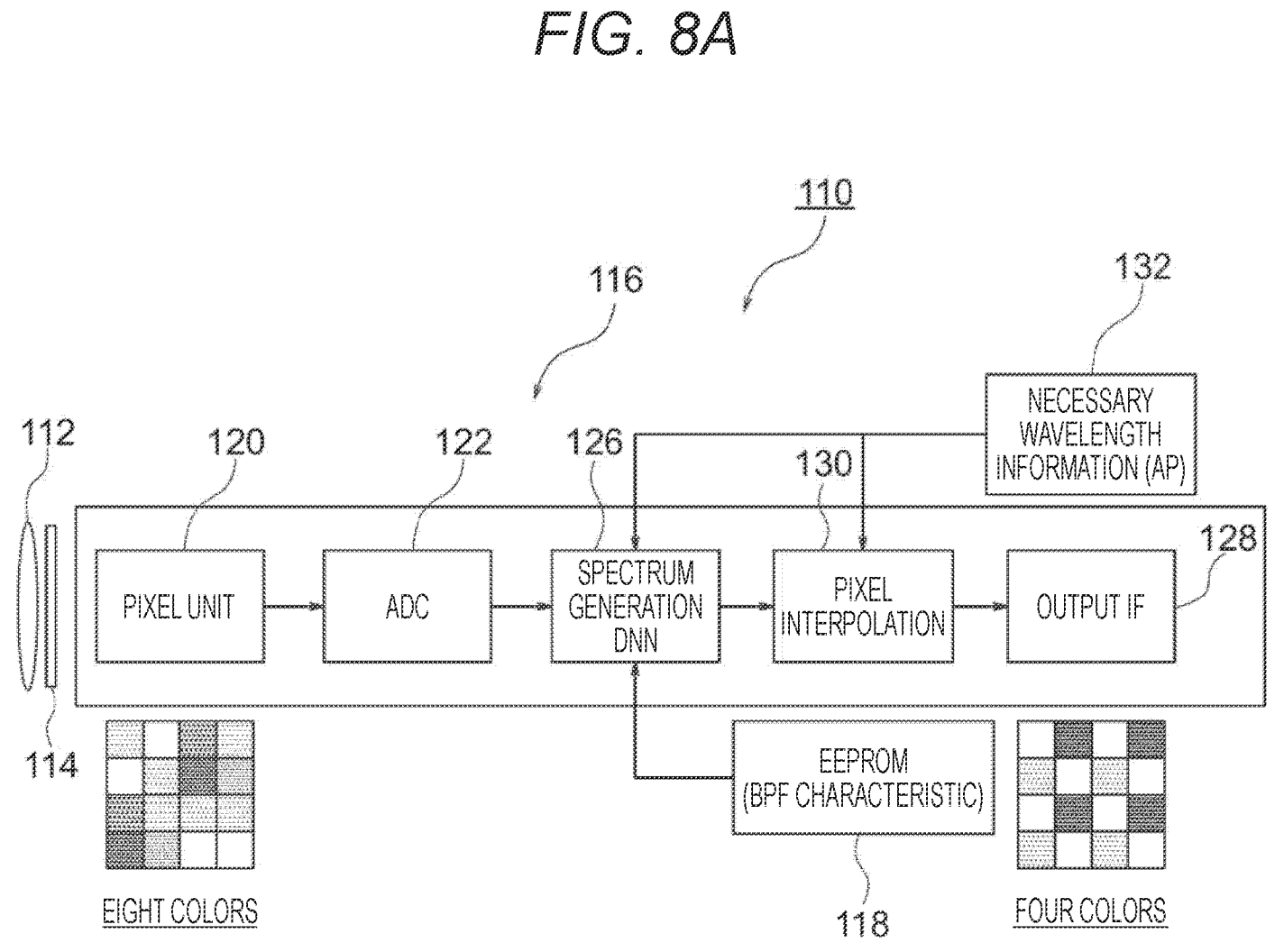

FIG. 8A is a diagram illustrating a configuration example of the imaging module 110 according to the third embodiment. The imaging module 110 further includes a second input unit 132 that inputs wavelength information (AP). The second input unit 132 includes, for example, a memory. Alternatively, the second input unit 132 may be configured as an input processing unit that acquires information directly from the application processor via an arbitrary IF (I2C, I3C, SPI, MIPI, or the like). Thus, even if the wavelength information (AP) is changed after the manufacturing of the imaging element 116, the change can be handled. The imaging element 116 further includes a pixel interpolation processing unit 130.

The pixel unit 120 includes 4×4 pixels as a pixel group constituting a basic unit. Furthermore, for example, eight types of color filters are arranged on-chip in the pixel group constituting the basic unit. Thus, the number of spectrums of the pixel group constituting the basic unit of the pixel unit 120 is eight.

On the basis of the wavelength information (AP) input from the second input unit 132, the spectrum generation processing unit 126 acquires, for example, a parameter used for a matrisk operation from the storage unit 118. For example, in a case where the number of spectrums of the input wavelength information (AP) is 4, the spectrum generation processing unit 126 performs calculation processing on a determinant of 4 rows and 8 columns with respect to an output signal value of 4×4 pixels. Note that the output signal of 4×4 pixels is converted into a digital signal value by the AD conversion unit 122.

The pixel interpolation processing unit 130 converts the array of pixel values of 4×4 pixels into an array of only four colors by using a processing result of the spectrum generation processing unit 126. The pixel interpolation processing unit 130 can also perform pixel interpolation processing when converting the array of pixel values of 4×4 pixels into an array of only four colors. For this pixel interpolation processing, a (Demosic) process of performing interpolation from information of peripheral pixels as used in conventional camera signal processing may be performed, or interpolation processing using a neural network may be used. Also in this arrangement order, the pixel interpolation processing unit 130 can perform arrangement on the basis of information input from the outside on the basis of the wavelength information (AP) input from the second input unit 132. Note that the spectrum generation processing unit 126 and the pixel interpolation processing unit 130 according to the present embodiment correspond to the processing unit. Furthermore, the second input unit 132 according to the present embodiment corresponds to the acquisition unit.

As described above, by the processes of the spectrum generation processing unit 126 and the pixel interpolation processing unit 130, coding of eight colors can be converted into coding of four colors. In normal camera signal processing, a system is often constructed so as to use three to four colors, and there is also an advantage that much of conventional signal processing can be reused by outputting four colors or less. Note that, although four colors are converted in the present embodiment, the number is arbitrary and is not limited thereto. Note that, similarly to the first embodiment, the spectrum generation processing unit 126 can change the output signal to an output signal having a larger number of spectrums than the type N of color filter by changing the parameter used for the matrisk operation. In this case, the pixel interpolation processing unit 130 can convert coding of N colors into coding having more colors than N colors.

FIG. 8B is a diagram illustrating a configuration example of the imaging module 110 without a lens. As illustrated in FIG. 8B, the imaging module 110 may be a lens-less imaging system, for example, a pinhole camera or a structure of pinhole pixels.

As described above, according to the present embodiment, the imaging module 110 performs the spectrum processing of making the number of spectrums of the signal output of each pixel of the unit part in the pixel unit 120 smaller than the type N of the color filter arranged in the unit part. Thus, it is possible to change to an image data format of the processing unit in the subsequent stage that performs processing using image data of the imaging module 110.

Fourth Embodiment

The imaging module 110 according to the fourth embodiment is different from the imaging module 110 according to the third embodiment in that an output signal having a new spectral characteristic is generated using an output signal of a binocular camera. Differences from the imaging module 110 according to the third embodiment will be described below.

Figure 9:
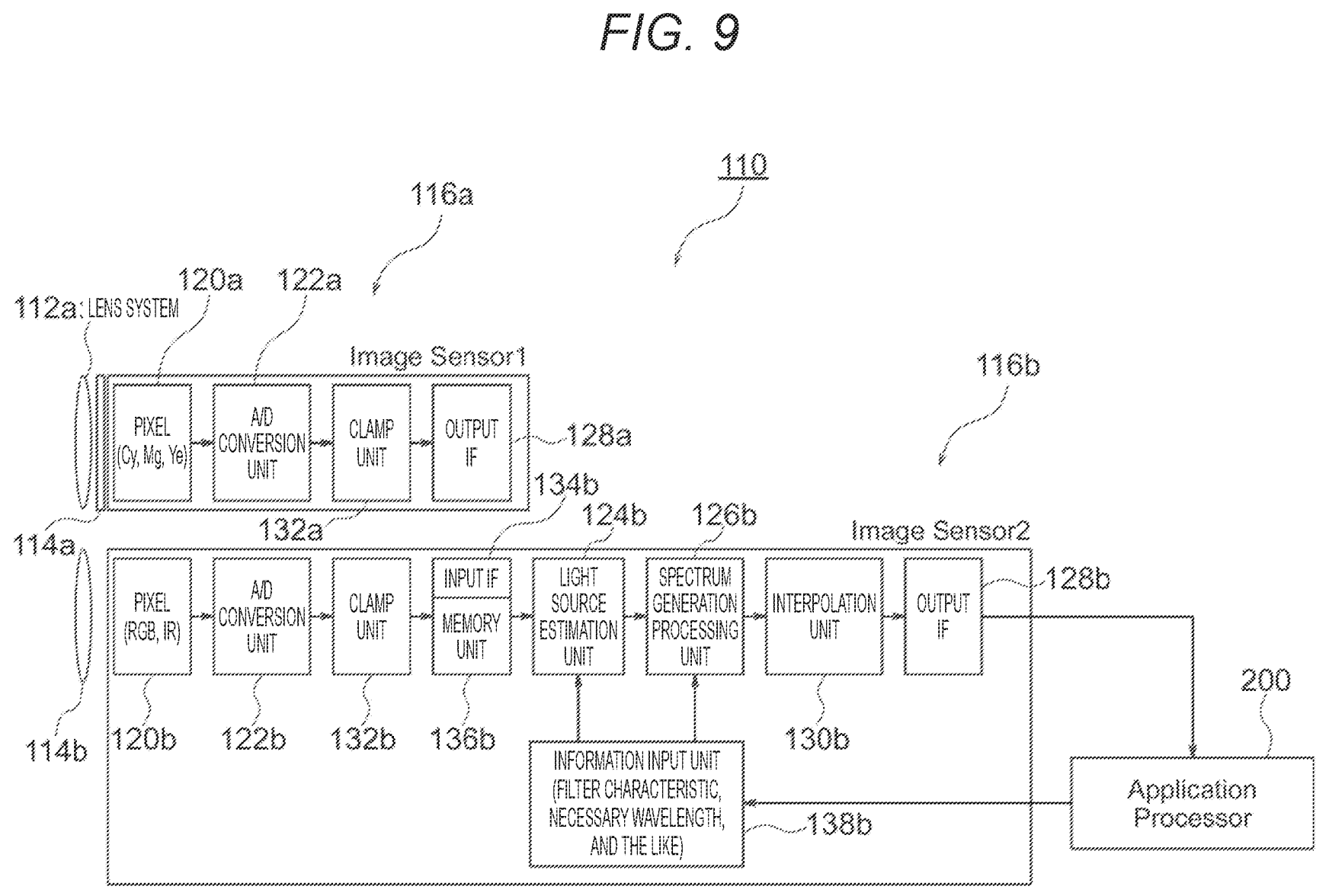

FIG. 9 is a diagram illustrating a configuration example of the imaging module 110 according to the fourth embodiment. The imaging module 110 according to the fourth embodiment includes a first lens system 112a, a first optical filter 114a, a first imaging element (Image Sensor 1) 116a, a second lens system 112b, and a second imaging element (Image Sensor 2) 116b. FIG. 9 further illustrates an application processing circuit (Application Processor) 200. In FIG. 9, "a" is attached to components related to the first imaging element 116a, and "b" is attached to components related to the second imaging element 116b. Furthermore, similar components to those described above are denoted by the same reference numerals, and the description thereof will be omitted. That is, the first imaging element 116a includes a pixel unit 120a, an AD converter 122a, a clamp unit 132a, and an output interface 128a. On the other hand, the first imaging element 116b includes a pixel unit 120b, an AD converter 122b, a clamp unit 132b, an input interface 134b, a memory unit 136b, the light source estimation unit 124, a spectrum generation processing unit 126b, a pixel interpolation processing unit 130b, an output interface 128b, and an information input unit 138b. Note that the information input unit 138b according to the present embodiment corresponds to the acquisition unit.

Figure 10:
FIG. 10 is a diagram illustrating a pixel array example of basic units of pixel units.
Figure 10:

FIG. 10 is a diagram illustrating a pixel array example of basic units of the pixel unit 120a and the pixel unit 120b. As illustrated in FIG. 10, the pixel unit 120a includes 4×4 pixels as a basic unit, and includes pixels of cyan, magenta, and yellow.

On the other hand, the pixel unit 120b has 4×4 pixels as a basic unit, and includes pixels of red (Red), green (Green), blue (Blue), and infrared (IR). That is, a cyan pixel and a red pixel have a complementary color relationship, a magenta pixel and a green pixel have a complementary color relationship, and a yellow pixel and a blue pixel have a complementary color relationship.

Referring again to FIG. 9, the clamp unit 132a executes, for example, processing related to the level of the ground in the image. For example, the clamp unit 132a defines a black level, subtracts the defined black level from image data output from the AD converter 122a, and outputs the image data.

The input interface 134b receives first image data output from the output interface 128a. The memory unit 136b stores the first image data and second image data output from the clamp unit 132b in association with each other. The information input unit 138b acquires a signal including information regarding the filter characteristic and the necessary wavelength from the application processing circuit 200, and supplies the signal to the light source estimation unit 124 and the spectrum generation processing unit 126b.

The spectrum generation processing unit 126b generates an output signal having a new spectral characteristic for each basic unit by using a first signal included in each basic unit of the first image data and a second signal included in each corresponding basic unit of the second image data. In the present embodiment, the first signal includes output signals of pixels of cyan, magenta, and yellow. On the other hand, the second signal includes output signals of pixels of red (Red), green (Green), blue (Blue), and infrared (IR) colors. Thus, the spectrum generation processing unit 126b can process signals corresponding to seven colors for each basic unit. Then, the spectrum generation processing unit 126b generates signals having M new spectral characteristics by, for example, a matrix operation of M rows and 7 columns. In this case, M can be more than 7. In this manner, by using output signals of the plurality of imaging modules 110, M can be made larger than 7. In this case, signals in more wavelength bands can be used than using only one of the first imaging element 116a and the second imaging element 116b, and accuracy of spectrum processing can be further improved. As can be seen from these, the different optical systems 112a and 112b and the different first filter 114a can be used in the first imaging element 116a and the second imaging element, and the spectrum generation processing unit 126b can use signals of more wavelength bands.

Note that, in a case where a pixel of an infrared (IR) color is included, since the infrared cut filter (IR-Cut Filter) cannot be used, the second imaging element may not include the infrared cut filter (IR-Cut Filter). Alternatively, a band pass filter may be used. In this manner, it is possible to use an optical filter or a lens suitable for each of the first imaging element 116a and the second imaging element.

FIG. 11 is a diagram illustrating a pixel array example of basic units of the pixel unit 120a and the pixel unit 120b different from those in FIG. 10. As illustrated in FIG. 11, the pixel unit 120a includes 4×4 pixels as a basic unit, and includes pixels of cyan, magenta, and yellow.

On the other hand, the pixel unit 120b has 4×4 pixels as a basic unit, and includes pixels of red, green, and blue. That is, a cyan pixel and a red pixel have a complementary color relationship, a magenta pixel and a green pixel have a complementary color relationship, and a yellow pixel and a blue pixel have a complementary color relationship.

Figure 12:
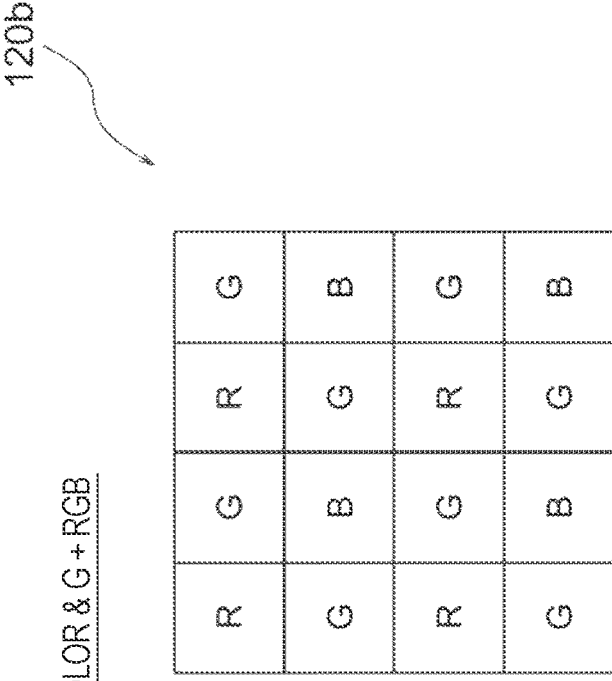
FIG. 12 is a diagram illustrating a pixel array example of basic units of the pixel units that are further different.

FIG. 12 is a diagram illustrating a pixel array example of basic units of the pixel unit 120a and the pixel unit 120b that are further different. As illustrated in FIG. 12, the pixel unit 120a has 4×4 pixels as a basic unit, and includes pixels of cyan, magenta, yellow, and green.

On the other hand, the pixel unit 120b has 4×4 pixels as a basic unit, and includes pixels of red, green, and blue. That is, a cyan pixel and a red pixel have a complementary color relationship, a magenta pixel and a green pixel have a complementary color relationship, and a yellow pixel and a blue pixel have a complementary color relationship.

FIG. 13 is a diagram illustrating a pixel array example of basic units of the pixel unit 120a and the pixel unit 120b different from those in FIGS. 10 to 12. As illustrated in FIG. 13, the pixel unit 120a includes 4×4 pixels as a basic unit, and includes pixels of cyan, magenta, and yellow.

On the other hand, the pixel unit 120b has 4×4 pixels as a basic unit, and includes pixels of red, green, blue, and white. That is, a cyan pixel and a red pixel have a complementary color relationship, a magenta pixel and a green pixel have a complementary color relationship, and a yellow pixel and a blue pixel have a complementary color relationship.

As described above, according to the present embodiment, the spectrum generation processing unit 126b generates the output signal having the new spectral characteristic for each basic unit by using the first signal included in each basic unit of the first image data generated by the first imaging element 116a and the second signal included in each corresponding basic unit of the second image data generated by the second imaging element 116b. Thus, signals in more wavelength bands can be used than using only one of the first imaging element 116a and the second imaging element 116b, and the accuracy of spectrum processing can be further improved.

Fifth Embodiment

Figure 14:
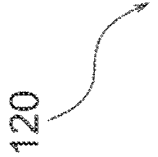
FIG. 14 is a diagram illustrating an example of a basic configuration of the pixel unit according to a fifth embodiment.

FIG. 14 is a diagram illustrating an example of a basic configuration of the pixel unit 120 according to the fifth embodiment. As illustrated in FIG. 14, the pixels of the basic configuration are configured by 8×8. Furthermore, the pixels adjacent to each other on the left and right sides include one of the same color filters M, R, Y, G, and C. That is, rectangles divided into left and right correspond to the photoelectric conversion unit (PhotoDiode). As described above, the pixel array to be applied may be arbitrary. Furthermore, one on-chip lens is provided for each color. The shape of the on-chip lens may be a square on-chip lens, or may be another shape such as a rectangle. The pixel unit 120 according to the fifth embodiment can be used for the pixel units 120 according to the first to fourth embodiments.

Figure 15:
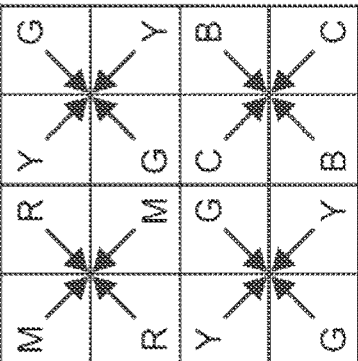
FIG. 15 is a diagram illustrating an example of another basic configuration of the pixel unit according to the fifth embodiment.
Figure 15:
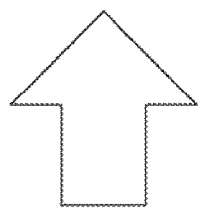
Figure 15:
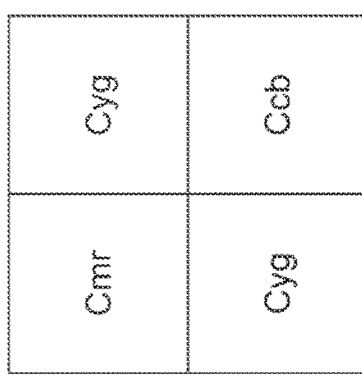

FIG. 15 is a diagram illustrating an example of another basic configuration of the pixel unit 120 according to the fifth embodiment. As illustrated in FIG. 15, the pixels of the basic configuration are configured by 4×4. Furthermore, 2×2 pixels can be added and read in an analog manner, and different spectrums can be obtained by addition and reading (see Patent Document 2). That is, upper left 2×2 pixels include pixels M and R, upper right 2×2 pixels include pixels Y and G, lower left 2×2 pixels include pixels Y and G, and lower right 2×2 pixels include pixels C and B. Then, an added color Cmr of the pixels M and R, an added color Cyg of the pixels Y and G, an added color Cyg of the pixels Y and G, and an added color Ccb of the pixels C and B are output as illustrated in the right diagram.

Figure 16:
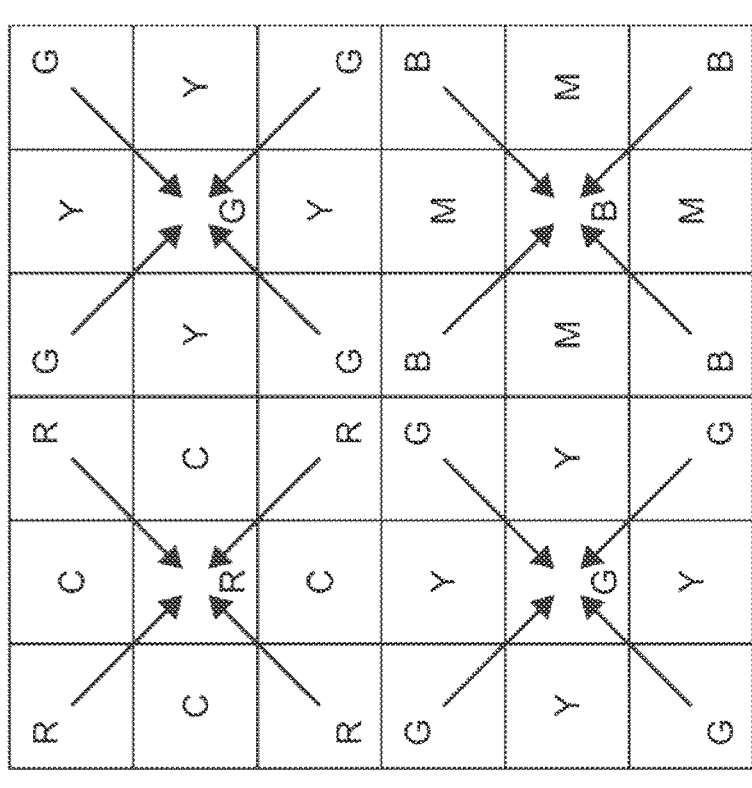
FIG. 16 is a diagram illustrating an example of pixels that can be added and read in an analog manner.

FIG. 16 is a diagram illustrating an example of pixels that can be added and read in an analog manner similarly to FIG. 15. As illustrated in FIG. 16, the pixels of the basic configuration are configured by 6×6. Furthermore, the 3×3 pixels can be added and read in an analog manner, and different spectrums can be obtained by addition and reading. That is, upper left 3×3 pixels include pixels M and R, upper right 3×3 pixels include pixels Y and G, lower left 3×3 pixels include pixels Y and G, and lower right 43×3 pixels include pixels C and B. Then, the added color Cmr of the pixels M and R, the added color Cyg of the pixels Y and G, the added color Cyg of the pixels Y and G, and the added color Ccb of the pixels C and B are output similarly to the right diagram of FIG. 15. The pixel units 120 illustrated in FIGS. 15 and 16 can be used for the pixel units 120 of the first to fourth embodiments.

Sixth Embodiment

FIG. 17 is a diagram illustrating a part of a cross-sectional view of the pixel unit 120 according to the sixth embodiment. As illustrated in FIG. 17, the pixel unit 120 includes, for example, an on-chip lens 400, organic photoelectric conversion films 402, 404, and 406, and photoelectric conversion elements (PhotoDide) 404, 406, and 408. The organic photoelectric conversion film 402 has a function equivalent to that of a color filter that does not transmit green light. Thus, from the light transmitted through the organic photoelectric conversion film 402, magenta color light which is the remaining light is photoelectrically converted by the photoelectric conversion element 408. Similarly, the organic photoelectric conversion film 404 has a function equivalent to that of a color filter that does not transmit red light. Thus, from the light transmitted through the organic photoelectric conversion film 404, cyan color light which is the remaining light is photoelectrically converted by the photoelectric conversion element 410. Similarly, the organic photoelectric conversion film 406 has a function equivalent to that of a color filter that does not transmit blue light. Thus, from the light transmitted through the organic photoelectric conversion film 404, cyan color light which is the remaining light is photoelectrically converted by the photoelectric conversion element 410. In the case of FIG. 17, it is assumed that 6 colors are included as the filter characteristic. That is, by implementing the present invention, it is possible to output seven or more colors of 6+1. The pixel unit 120 illustrated in FIG. 17 can be used for the pixel units 120 of the first to fifth embodiments.

As described above, in the pixel according to the present embodiment, the filter refers to all things that affect the spectrum. For example, the spectral characteristics of the organic photoelectric conversion films 402, 404, and 406 and the photoelectric conversion elements (PhotoDide) 404, 406, and 408 are also referred to as filters. For example, in a case where a plasmon filter using plasmon resonance and Fabry-Perot using a refractive index difference is used for the spectrum, the filter includes a plasmon filter and Fabry-Perot.

Seventh Embodiment

FIG. 18 is a diagram illustrating an example in which the imaging modules (stereo camera modules) 110a and 110b according to the present embodiment are applied to a smartphone 1000b as an electronic device. In a smartphone 1000a, the camera 1002a is disposed on the display 1006a side. Thus, it is necessary to arrange the camera 1002a in a bezel, and there are design restrictions on the arrangement of the display 1006a.

The smartphone 1000b according to the present embodiment illustrated in FIG. 18 is a smartphone incorporating the imaging module (image generation device) 110 described in the first to sixth embodiments of the present disclosure. This is an example of a stereo type including two imaging modules 110. In the smartphone 1000b according to the present embodiment, the imaging modules 110a and 110b are arranged on the back surface side of the display 1006b together with the component layer 1004b, and capture images via the display 1006b. Thus, there is no restriction on the design of the display 1006b, and the display 1006b can be arranged on the entire surface of the smartphone 1000b. The display 1006a is, for example, an OLED panel.

As described above, in a case where the imaging modules 110a and 110b according to the present embodiment are arranged in the smartphone 1000a, it is possible to generate an image signal having spectral characteristics according to a purpose such as object identification. Thus, the accuracy of object identification can be improved at the time of image-capturing by camera. Thus, accuracy of scene determination and the like at the time of image-capturing by camera is improved by object identification, and appropriate image capturing can be performed. Furthermore, in a case where the imaging modules 110a and 110b according to the present embodiment are applied to the smartphone 1000a, the data efficiency is further improved. That is, since the wavelength to be output can be limited according to the purpose, there is an effect of improving identification accuracy, and since it is possible to perform wavelength generation processing in the imaging modules 110a and 110b, the power consumption can be suppressed.

Furthermore, as illustrated in FIG. 18, by arranging the imaging modules 110a and 110b below the display (below the touch panel), the user's finger can be sensed, and blood circulation and oxygen saturation can be detected. In this case, the finger can also be irradiated with a light source of the OLED as a light source. In a case of such an example, information such as transmittance of the OLED panel can also be input at the time of inputting the filter characteristic. Furthermore, since the light source is known, wavelength information of the OLED light source and the like may also be included. Thus, the imaging modules 110a and 110b can generate output signals having spectral characteristics more suitable for sensing. Furthermore, in addition to the information regarding the optical filter described above, the input of the filter characteristic may be general information regarding wavelength information received by the imaging modules 110a and 110b, and may further include information such as light source spectrum and manufacturing variation.

Figure 19:
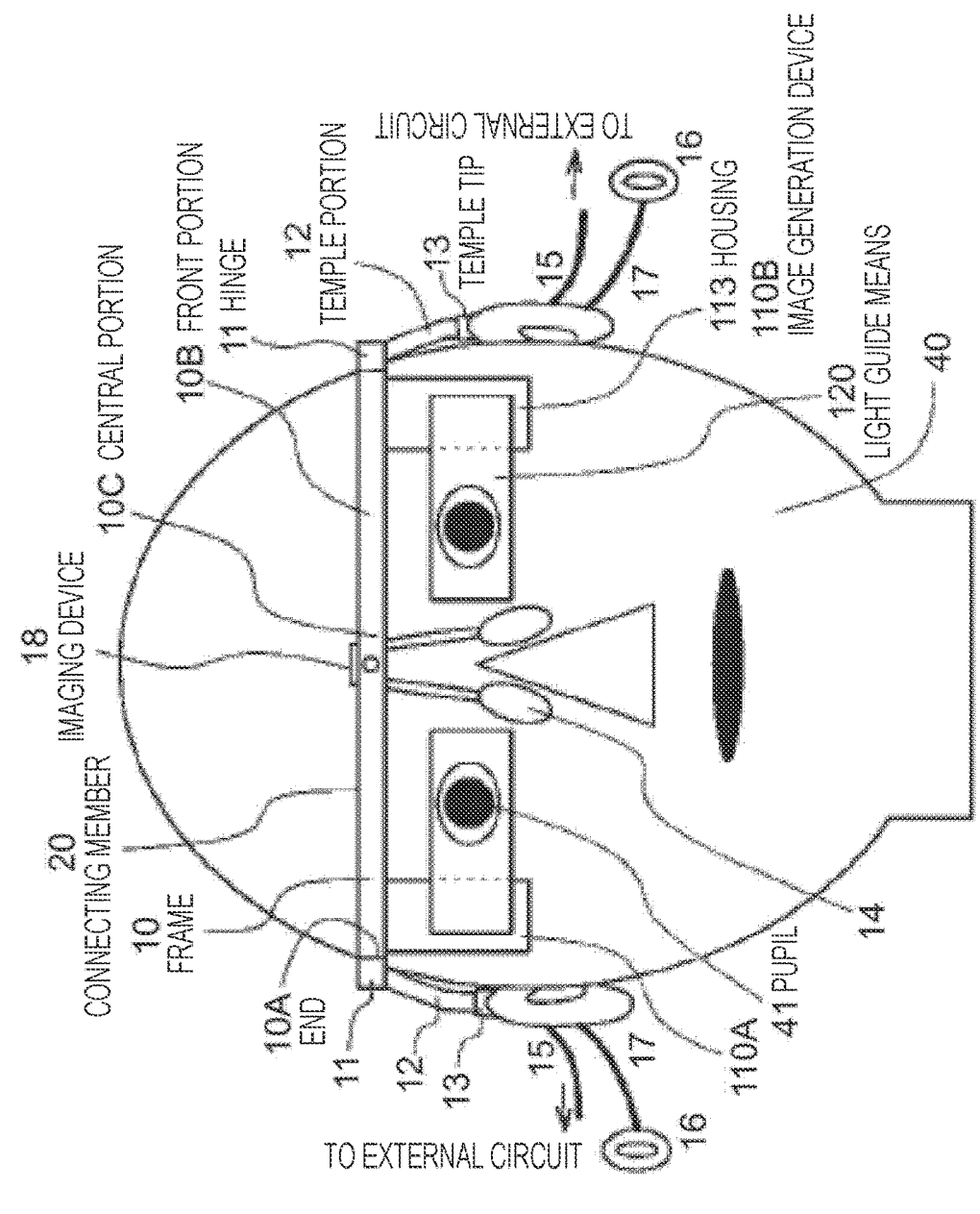
FIG. 19 is a diagram illustrating an example in which the imaging modules are applied to a head mounted display as an electronic device.

FIG. 19 is a diagram illustrating an example in which the imaging modules (image generation devices) 110a and 110b according to the present embodiment are applied to a VR/AR/MR head mounted display (HMD) as an electronic device. The head mounted display illustrated in FIG. 19 is a head mounted display incorporating the imaging module (image generation device) 110 described in the first to sixth embodiments of the present disclosure. The head mounted display illustrated in FIG. 18 includes an eyeglass-type frame 10 mounted on the head of the observer 40 and two imaging modules (image generation devices) 110a and 110b. The connecting member 20 is attached to a side facing observer of the central portion 10C of the frame 10 located between the two pupils 41 of the observer 40. The frame 10 includes a front portion 10B arranged in front of the observer 40, two temple portions 12 rotatably attached to both ends of the front portion 10B via hinges 11, and temple tips 13 attached to respective distal end portions of the temple portions 12, and the connecting member 20 is attached to a central portion 10C of the front portion 10B positioned between two pupils 41 of the observer 40. A wiring 17 for a headphone part extends from the distal end portion of the temple tip 13 to a headphone part 16 via the temple portion 12 and the inside of the temple tip 13. More specifically, the wiring 17 for the headphone part extends from the tip portion of the temple tip 13 to the headphone part 16 so as to wrap around the back side of the pinna (auricle).

As described above, the electronic device incorporating the imaging module 110 described in the first to sixth embodiments of the present disclosure is not limited to the smartphone, and may be the VR/AR/MR head mounted display (HMD) as illustrated in FIG. 19, or may be a single-lens reflex camera or a capsule endoscope. Furthermore, the imaging module 110 is not necessarily limited to one for capturing a picture, and may include sensing for the purpose of authentication sensor, skin analysis, healthcare, or the like. Alternatively, the imaging module 110 may have a sensing function for other purposes.

Eighth Embodiment

The imaging module 110 according to the present embodiment is different from the imaging module 110 in the first to seventh embodiments in that the spectrum generation processing unit 126 can further have a function of changing spectrum processing for each imaging frame. Hereinafter, differences from the imaging module 110 according to the first to seventh embodiments will be described.

The spectrum generation processing unit 126 changes, for example, the parameters of the linear matrix for each imaging frame. For example, signals corresponding to three wavelengths (three colors) of 400, 450, and 500 nm are output in the first frame, and signals corresponding to wavelengths of 550, 600, and 650 nm are output in the next frame. Since the calculation processing of the spectrum generation processing unit 126 is performed in the imaging module 110, the control in the time axis direction can be arbitrarily changed. Thus, it is possible to output an output signal having different spectral characteristics for each frame in real time. As described above, the application processor that receives the output signal of the imaging module 110 is often constructed on the premise of generally receiving an array of three to four colors.

For example, the imaging module 110 according to the present embodiment outputs signals corresponding to three wavelengths of 400, 450, and 500 nm in the first frame, and outputs signals corresponding to three wavelengths of 550, 600, and 650 nm in the second frame. Thus, for example, image data having an array of six colors can be transmitted to an application processor constructed on the premise of receiving an array of three colors. As described above, in a case where there is a restriction on the number of color arrangements, it is possible to remove the restriction on the number of color arrangements by outputting signals corresponding to different wavelength bands for each frame as in the present embodiment. Note that the number of time divisions and the wavelength band corresponding to the output signal can be arbitrarily set.

In addition, the spectrum generation processing unit 126 may cause signals corresponding to the same wavelength band to be output between frames. Furthermore, the spectrum generation processing unit 126 can perform dynamic correction of the subject by using processed signals having common spectral characteristics. For example, in the frame 1, signals corresponding to three wavelengths of 400 nm, 500 nm, and 600 nm may be output, and in the frame 2, signals corresponding to three wavelengths of 300 nm, 500 nm, and 700 nm may be output. That is, signals corresponding to the same wavelength may be output between frames. For example, in a case where the subject is a moving object (moving subject), it is possible to more accurately correct the motion of the same subject by outputting signals corresponding to the same wavelength between frames.

Furthermore, as illustrated in FIG. 2, the sensitivity of each pixel to the input light is different. In particular, the photosensitivity of the infrared (IR, Black) pixel is lowered. In order to correct such a sensitivity difference for each color, in the imaging module 110, exposure control may be changed for each pixel, or for each frame, between the imaging modules 110, or the like. In addition, the color filter may be formed by overlapping a plurality of color filters. For example, when blue and red color filters are physically stacked, the color filter becomes a black (transmitting only IR) color filter.

As described above, according to the present embodiment, the spectrum generation processing unit 126 further has a function of changing spectrum processing for each imaging frame. This makes it possible to output a signal to an application processor having a restriction on the number of color arrangements in a case where a plurality of colors is handled at the same time.

Figure 20:
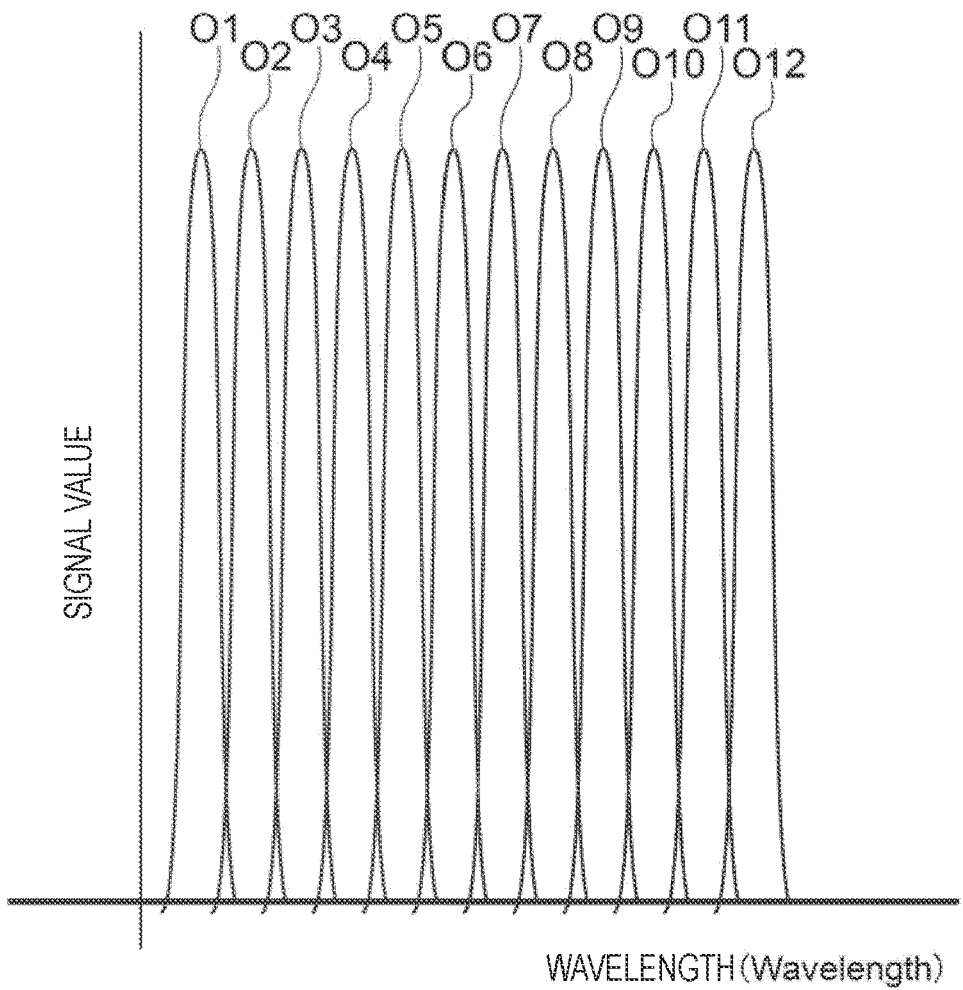
FIG. 20 is a diagram illustrating an example of spectral characteristics.

FIG. 20 is a diagram illustrating an example of spectral characteristics. The horizontal axis represents a wavelength, and the vertical axis represents an example of a signal value. Signal values O1 to O12 indicate variations in the magnitude of the signal with respect to input light in a predetermined wavelength range, for example, 300 to 1000 nanometers. Each of the signal force values O1 to O12 is divided into, for example, 12 wavelength bands from the ultraviolet region to the infrared region, and has a maximum value of the signal value in each wavelength band. In FIG. 20, symbols O1 to O12 are assigned in order from the low wavelength side to the high wavelength side by the wavelength band corresponding to the maximum value of the signal value (which may also be referred to as output).

Note that the present technology can have configurations as follows.

(1)

An imaging element configured as a semiconductor chip, the imaging element including:

an acquisition unit that acquires information regarding an optical member, the optical member being provided outside the semiconductor chip;

a pixel unit including N (N is an integer) types of pixels having different spectral characteristics with respect to a wavelength of input light input via the optical member;

a conversion unit that converts an output signal of the pixel unit into a digital output signal;

a processing unit that performs conversion processing into N+1 or more processed signals having different spectral characteristics on the basis of an output signal output from the conversion unit by using the information; and an output unit that outputs a signal based on the processed signal to an outside of the semiconductor chip.

(2)

The imaging element according to (1), in which the pixel unit includes a plurality of photoelectric conversion elements that converts the input light into the output signal via N types of filters.

(3)

The imaging element according to (2), in which N is 5 or more.

(4)

The imaging element according to (1), in which the imaging element is configured in one semiconductor chip portion or in a plurality of adjacent semiconductor chip portions.

(5)

The imaging element according to (1), in which the information relates to an optical characteristic of the optical member between the imaging element and the subject, and relates to at least one of transmittance, reflectance, refractive index, emission wavelength, or wavelength dependency.

(6)

The imaging element according to (1), in which the optical member is at least one of a color filter, a plasmon, or an organic photoelectric conversion film.

(7)

The imaging element according to (2), in which the N types of filters include four or more types of filters among filters that transmit any of red color light, green color light, blue color light, cyan color light, magenta color light, and yellow color light.

(8)

The imaging element according to (1), in which the acquisition unit is a memory (EEPROM) capable of storing the information from outside the semiconductor chip, and the information from outside the semiconductor chip stored in the memory is supplied to the processing unit.

(9)

The imaging element according to (1), in which the optical member is a band pass filter.

(10)

The imaging element according to (9), in which the band pass filter transmits light in a predetermined visible light region and light in a predetermined infrared (IR) region.

(11)

The imaging element according to (1), in which the processing unit is capable of performing processing using a parameter related to an image-capturing environment, and the acquisition unit is capable of acquiring the parameter including at least information regarding a light source estimation result.

(12)

The imaging element according to (1), in which the processed signal output by the processing unit is image data according to predetermined array information, and the acquisition unit is capable of acquiring at least one of information regarding the N+1 or more spectral characteristics or information regarding the array information.

(13)

The imaging element according to (1), in which each of the processed signals has a peak of photosensitivity in each of the N+1 or more wavelength bands in input light in a predetermined wavelength range, and the processing unit is capable of changing a range of at least one of the N+1 or more wavelength bands by parameter setting from outside the semiconductor chip.

(14)

The imaging element according to (1), in which the processed signal output by the processing unit is image data according to predetermined array information, and the processing unit is capable of changing a pixel array of the image data by parameter setting from outside the semiconductor chip.

(15)

The imaging element according to (1), in which the optical member is at least a display panel for display, and the processing unit generates the processed signal by using at least information regarding an optical characteristic of the display panel.

(16)

The imaging element according to (1), in which the processing unit generates the processed signal also on the basis of output signals generated by different imaging elements.

(17)

The imaging element according to (1), in which the pixel unit includes one of an organic photoelectric conversion film and a divided photodiode divided in a cross-sectional direction.

(18)

The imaging element according to (1), in which in the processing unit, a combination in the processed signal generated in a first frame is different from a combination in the processed signal generated in a second frame generated next to the first frame.

(19)

The imaging element according to (18), in which the processing unit generates M (M is an integer and M<N+1) processed signals in the N+1 of the processed signals as the first frame, and generates remaining processed signals in the N+1 of the processed signals as the second frame.

(20)

The imaging element according to (1), in which the pixel unit is subjected to different exposure control between frames or between pixels.

(21)

The imaging element according to (13), in which the pixel unit includes at least one of a white pixel or a gray pixel having sensitivity in a wide wavelength band overlapping with a wavelength band having sensitivity of another pixel with respect to input light in the predetermined wavelength range.

(22)

The imaging element according to (2), in which in spectral characteristics of the N types of filters, there is an overlap at one or more positions of a wavelength band to be transmitted.

(23)

The imaging element according to (1), in which the spectral characteristic indicates a variation in magnitude of a processed signal with respect to input light in a predetermined wavelength range, and in a case where the optical member is a band pass filter, the processing unit performs processing of further narrowing a half value width of a variation value of a processed signal with respect to a wavelength in input light in at least any one of the N+1 or more processed signals.

(24)

The imaging element according to (18), in which the processing unit includes at least one processed signal having a common spectral characteristic in the processed signal in the first frame and the processed signal in the second frame, respectively.

(25)

The imaging element according to (24), in which the processing unit is capable of performing dynamic correction of a subject by using a processed signal having the common spectral characteristic.

(26)

An electronic device including the imaging element according to (1).

Aspects of the present disclosure are not limited to the above-described individual embodiments, but include various modifications that can be conceived by those skilled in the art, and the effects of the present disclosure are not limited to the above-described contents. That is, various additions, modifications, and partial deletions can be made without departing from the conceptual idea and spirit of the present disclosure derived from the contents defined in the claims and equivalents thereof.

The invention claimed is:

1. An imaging element configured as a semiconductor chip, the imaging element comprising:

an acquisition unit that acquires information regarding an optical member, the optical member being provided outside the semiconductor chip;

a pixel unit including N (N is an integer) types of pixels having different spectral characteristics with respect to a wavelength of input light input via the optical member;

a conversion unit that converts an output signal of the pixel unit into a digital output signal;

a processing unit that performs conversion processing into N+1 or more processed signals having different spectral characteristics on a basis of the digital output signal output from the conversion unit by using the information; and an output unit that outputs a signal based on the processed signal to an outside of the semiconductor chip.

2. The imaging element according to claim 1, wherein the pixel unit includes a plurality of photoelectric conversion elements that converts the input light into the output signal via N types of filters.

3. The imaging element according to claim 2, wherein the N is 5 or more.

4. The imaging element according to claim 1, wherein the imaging element is configured in one semiconductor chip portion or in a plurality of electrically connected semiconductor chip portions.

5. The imaging element according to claim 1, wherein the information relates to an optical characteristic of the optical member between the pixel unit and a subject, and relates to at least one of transmittance, reflectance, refractive index, emission wavelength, or wavelength dependency.

6. The imaging element according to claim 1, wherein the optical member is at least one of a color filter, a plasmon, or an organic photoelectric conversion film.

7. The imaging element according to claim 3, wherein the N types of filters include four or more types of filters among filters that transmit any of red color light, green color light, blue color light, cyan color light, magenta color light, and yellow color light.

8. The imaging element according to claim 1, wherein the acquisition unit is a memory (EEPROM) capable of storing the information from outside the semiconductor chip, and the information from outside the semiconductor chip stored in the memory is supplied to the processing unit.

9. The imaging element according to claim 1, wherein the optical member is a band pass filter.

10. The imaging element according to claim 9, wherein the band pass filter transmits light in a predetermined visible light region and light in a predetermined infrared (IR) region.

11. The imaging element according to claim 1, wherein the processing unit is capable of performing processing using a parameter related to an image-capturing environment, and the acquisition unit is capable of acquiring the parameter including at least information regarding a light source estimation result.

12. The imaging element according to claim 1, wherein the processed signal output by the processing unit is image data according to predetermined array information, and the acquisition unit is capable of acquiring at least one of information regarding the N+1 or more spectral characteristics or information regarding the array information.

13. The imaging element according to claim 1, wherein each of the processed signals has a peak of photosensitivity in each of the N+1 or more wavelength bands in input light in a predetermined wavelength range, and the processing unit is capable of changing a range of at least one of the N+1 or more wavelength bands by parameter setting from outside the semiconductor chip.

14. The imaging element according to claim 1, wherein the processed signal output by the processing unit is image data according to predetermined array information, and the processing unit is capable of changing a pixel array of the image data by parameter setting from outside the semiconductor chip.

15. The imaging element according to claim 1, wherein the optical member is at least a display panel for display, and the processing unit generates the processed signal by using at least information regarding an optical characteristic of the display panel.

16. The imaging element according to claim 1, wherein the processing unit generates the processed signal also on a basis of output signals generated by different imaging elements.

17. The imaging element according to claim 1, wherein the pixel unit includes one of an organic photoelectric conversion film and a divided photodiode divided in a cross-sectional direction.

18. The imaging element according to claim 1, wherein in the processing unit, a combination in the processed signal generated in a first frame is different from a combination in the processed signal generated in a second frame generated next to the first frame.

19. The imaging element according to claim 18, wherein the processing unit generates M (M is an integer and M<N+1) processed signals in the N+1 of the processed signals as the first frame, and generates remaining processed signals in the N+1 of the processed signals as the second frame.

20. The imaging element according to claim 1, wherein the pixel unit is subjected to different exposure control between frames or between pixels.

21. The imaging element according to claim 13, wherein the pixel unit includes at least one of a white pixel or a gray pixel having sensitivity in a wide wavelength band overlapping with a wavelength band having sensitivity of another pixel with respect to input light in the predetermined wavelength range.

22. The imaging element according to claim 2, wherein in spectral characteristics of the N types of filters, there is an overlap at one or more positions of a wavelength band to be transmitted.

23. The imaging element according to claim 1, wherein the spectral characteristic indicates a variation in magnitude of a processed signal with respect to input light in a predetermined wavelength range, and in a case where the optical member is a band pass filter, the processing unit performs processing of further narrowing a half value width of a variation value of a processed signal with respect to a wavelength in input light in at least any one of the N+1 or more processed signals.

24. The imaging element according to claim 18, wherein the processing unit includes at least one processed signal having a common spectral characteristic in the processed signal in the first frame and the processed signal in the second frame, respectively.

25. The imaging element according to claim 24, wherein the processing unit is capable of performing dynamic correction of a subject by using a processed signal having the common spectral characteristic.

26. An electronic device comprising the imaging element according to claim 1.

* * * * *